US009287456B2

United States Patent
Suwa et al.

(10) Patent No.: US 9,287,456 B2
(45) Date of Patent: Mar. 15, 2016

(54) SILICON-GERMANIUM LIGHT-EMITTING ELEMENT

(75) Inventors: Yuji Suwa, Tokyo (JP); Shinichi Saito, Tokyo (JP); Etsuko Nomoto, Tokyo (JP); Makoto Takahashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/127,837

(22) PCT Filed: Jun. 12, 2012

(86) PCT No.: PCT/JP2012/065047
§ 371 (c)(1),
(2), (4) Date: Mar. 5, 2014

(87) PCT Pub. No.: WO2013/002023
PCT Pub. Date: Jan. 3, 2013

(65) Prior Publication Data
US 2014/0175490 A1 Jun. 26, 2014

(30) Foreign Application Priority Data
Jun. 28, 2011 (JP) .................. 2011-143420

(51) Int. Cl.
*H01L 33/06* (2010.01)
*H01L 33/34* (2010.01)
(Continued)

(52) U.S. Cl.
CPC ............ *H01L 33/36* (2013.01); *H01L 33/0054* (2013.01); *H01L 33/06* (2013.01);
(Continued)

(58) Field of Classification Search
CPC ..... H01L 33/04; H01L 33/06; H01L 33/0054; H01L 33/34; H01S 5/105; H01S 5/3027; H01S 5/3031; H01S 5/3223; H01S 5/3224
See application file for complete search history.

(56) References Cited

U.S. PATENT DOCUMENTS 5,539,214 A * 7/1996 Lynch et al. .................. 257/15
7,750,364 B2 7/2010 Yamamoto et al.
(Continued)

FOREIGN PATENT DOCUMENTS

JP 06-140669 A 5/1994
JP 08-046237 A 2/1996
(Continued)

OTHER PUBLICATIONS

Tanabe et al., "Low power and fast electro-optic silicon modulator with lateral p-i-n embedded photonic crystal nanocavity", Optics Express, vol. 17, No. 25, Dec. 7, 2009, p. 22505-22513.*
(Continued)

*Primary Examiner* — Yu Chen
(74) *Attorney, Agent, or Firm* — Mattingly & Malur, PC

(57) ABSTRACT

Provided is an element structure whereby it is possible to produce a silicon-germanium light-emitting element enclosing an injected carrier within a light-emitting region. Also provided is a method of manufacturing the structure. Between the light-emitting region and an electrode there is produced a narrow passage for the carrier, specifically, a one-dimensional or two-dimensional quantum confinement region. A band gap opens up in this section due to the quantum confinement, thereby forming an energy barrier for both electrons and positive holes, and affording an effect analogous to a double hetero structure in an ordinary Group III-V semiconductor laser. Because no chemical elements other than those used in ordinary silicon processes are employed, the element can be manufactured inexpensively, simply by controlling the shape of the element.

7 Claims, 15 Drawing Sheets

(51) Int. Cl.
*H01L 33/36* (2010.01)
*H01L 33/00* (2010.01)
*H01S 5/32* (2006.01)
*H01L 33/20* (2010.01)
*H01S 5/042* (2006.01)
*H01S 5/10* (2006.01)

(52) U.S. Cl.
CPC ............ *H01L 33/34* (2013.01); *H01S 5/3224* (2013.01); *H01L 33/20* (2013.01); *H01S 5/0424* (2013.01); *H01S 5/1032* (2013.01)

(56) References Cited

U.S. PATENT DOCUMENTS

| | | |
|---|---|---|
| 2005/0017257 A1 | 1/2005 | Green et al. |
| 2008/0128713 A1 | 6/2008 | Saito et al. |
| 2008/0197362 A1* | 8/2008 | Hisamoto et al. ............... 257/86 |
| 2010/0090230 A1* | 4/2010 | Honma ........................ 257/89 |

FOREIGN PATENT DOCUMENTS

| | | |
|---|---|---|
| JP | 2004-527921 A | 9/2004 |
| JP | 2007-294628 A | 11/2007 |
| JP | 2008-205003 A | 9/2008 |
| JP | 2009-054873 A | 3/2009 |
| JP | 2010-238722 A | 10/2010 |

OTHER PUBLICATIONS

Dictionary.com, "emit," in Dictionary.com Unabridged. Source location: Random House, Inc. http://dictionary.reference.com/browse/emit. Available: http://dictionary.reference.com. Accessed: Jun. 18, 2015.*

Chan et al., Applied Physics Letters (Appl. Phys. Lett.), 2006, vol. 88, pp. 143508-1 to 143508-3.

Canham, Applied Physics Letters (Appl. Phys. Lett.), 1990, vol. 57, pp. 1046 to 1048.

Coffa et al., Applied Physics Letters (Appl. Phys. Lett.), 1996, vol. 69, pp. 2077 to 2079.

Iacona et al., Journal of Applied Physics (J. Appl. Phys.), 2001, vol. 89, pp. 8354 to 8356.

Coffa, IEEE Spectrum, Oct. 2005, pp. 44 to 49.

Fang et al., IEEE Photonics Technology Letters, 2006, vol. 18, pp. 1143 to 1145.

* cited by examiner

SILICON-GERMANIUM LIGHT-EMITTING ELEMENT

TECHNICAL FIELD

The present invention relates to a light-emitting element using silicon or germanium, and more particularly to an element structure which is suitable for a high luminosity light-emitting diode or a laser.

BACKGROUND ART

In the broad band network bolstering the internet industry, an optical communication is adopted. In transmission and reception of light in this optical communication, a laser using a compound semiconductor of a Group III-V, a Group II-VI or the like is used.

Among various structures proposed in the compound-semiconductor laser, a double hetero-structure is general. The double hetero-structure has a structure where two different kinds of compound semiconductors are used; a compound semiconductor having a smaller band gap is sandwiched by compound semiconductors each having a larger band gap. For the purpose of manufacturing the double hetero-structure, a compound semiconductor of conductivity which is an n-type, a compound semiconductor of conductivity which is i-type and is not doped, and a compound semiconductor of conductivity which is n-type are continuously epitaxially grown on a substrate to be laminated in a vertical direction. At the same time, it is necessary to pay attention to a band structure of the i-type compound semiconductor which is sandwiched in-between and not doped. It is important that a band gap of the i-type compound semiconductor is smaller than that of each of the n-type and p-type compound semiconductors, a conduction band level of the i-type is lower than a conduction band level of the n-type, and a valence band level of the i-type is higher than a valence band level of the p-type.

That is, both of electrons and holes are confined within the i-type region. This structure makes it easier for the electrons and holes to stay in a same region; therefore, the probability that the electrons and holes collide to annihilate each other increases, which improves a luminous efficiency as a result. In addition, a refractive index has a tendency to be larger as the band gap becomes smaller. Materials are, therefore, selected in such a way that the refractive index of the i-type compound semiconductor is larger than each of the refractive index of the n-type and p-type compound semiconductors, which results in that the light is also confined in the i-type compound semiconductor. The light thus confined efficiently induces a recombination of the electrons and holes which form an inverted distribution and leads to the laser oscillation.

Big amounts of long-distance information communication are made at once by the optical communication using the compound semiconductor which efficiently emits light in the manner as above. That is to say, the information processing and storage are executed on the LSI using silicon as a backbone, and the transmission of information is carried out by the laser using the compound semiconductor(s) as a backbone. If the silicon can be made to emit light with high efficiency, then, the electronic device and the light-emitting element can be integrated together with each other on a silicon chip. Therefore, its industrial value is enormous. Then, the research to make the silicon emit light has been largely done.

When the light-emitting element is to be manufactured on the silicon LSI to increase the integration degree, it will be effective as the second best to manufacture a highly efficient light-emitting element by germanium. This is because the degree of difficulty in manufacturing the light-emitting element by germanium is higher than that in an on-chip formation of the silicon light-emitting element, but is much lower than that in an on-chip formation of the compound semiconductor light-emitting element. In contrast, when a logic circuit, the light-emitting element, and an optical interconnection (optical waveguide) are manufactured on a same chip, a volume the waveguide occupies becomes larger than that the light-emitting element occupies. If the waveguide can be formed of silicon, the entire formation efficiency will improve. In this case, if the light-emitting element is also made of silicon a wavelength of the emitted light and a wavelength of light which tends to be absorbed in the waveguide will agree with each other. Hence, the germanium light-emitting element which emits light with a wavelength different from an absorption wavelength of silicon might be rather useful in some cases.

For the integration of the light-emitting elements, it is desirable to cause either silicon or germanium to efficiently emit light, which is not easy because germanium and silicon have an indirect transition band structure. The indirect transition band structure means a band structure in which a point k at which the energy of the conduction band becomes lowest (a position on a space k), and a point k at which the energy of the valence band becomes highest do not agree with each other. In the case of silicon, the highest energy point of the valence band is a point k called a point $\Gamma$ of $(k_x, k_y, k_z)=(0, 0, 0)$. However, the lowest energy point of the conduction band is not present in the point $\Gamma$, but is present between the point $\Gamma$ and a point X $(\pm\pi/a, 0, 0)$, $(0, \pm\pi/a, 0)$, $(0, 0, \pm\pi/a)$. More specifically, letting a be a lattice constant with $k_0=0.85*\pi/a$, the lowest energy point of the conduction band is present in a state of being regenerated to six points: $(0, 0, \pm k_0)$, $(0, \pm k_0, 0)$, $(\pm k_0, 0, 0)$. In the case of germanium, the highest energy point of the valence band is the point $\Gamma$. However, the lowest energy point of the valence band is present in a state of being regenerated to eight points (since the point L which is a point symmetry with the point $\Gamma$ as a center is equivalent to one another, the number of independent ones is four): $(\pm\pi/2a, \pm\pi/2a, \pm\pi/2a)$ which are called point L.

Whereas, many compound semiconductors are each called a direct transition semiconductor because the valence band highest energy point and the conduction band lowest energy point are each present at the point $\Gamma$.

A description will now be given with respect to the reason the luminous efficiency is lower in the indirect transition semiconductor, and the luminous efficiency is higher in the direct transition semiconductor. As has been described, to make the semiconductor element emit light, the electron and hole must collide to annihilate each other, and an energy difference between these two must be extracted as the light. In this case, the conservation law of energy and that of momentum must be both met. The electron has the energy level in the conduction band, and the hole has the energy level in a portion of valence band without the electron. The difference between these two turns into the energy the light possesses; extremely energy has different wavelength. The energy difference between the conduction band and the valence band, that is, the size of the band gap determines the wavelength of the light, that is, the color. It is thus impossible to find out an enormous difficulty in the establishment of the conservation law of energy.

On the other hand, since the phenomenon of the collision between the electron and hole is involved in the light emission, the momentum must be conserved. The momentum of the electron and hole is each proportional to a vector k representing the point k. According to the quantum mechanics as the law which governs the microscopic world, although the electron, the hole, and the photon (quantum of light) are each the wave, they are each scattered as the particle at the same time. Therefore, the law of conservation of momentum holds. The momentum is qualitatively a scale which quantifies how much momentum the particle is flicked by during the collision. It is understood from the dispersion relationship of the light ($\omega$=ck where $\omega$ is the angular frequency, c is the light velocity, and k is the momentum of the photon) and the energy that the momentum of the photon within the crystal is estimated to be almost zero. This means that even if there is a phenomenon in which the light flicks the matter by collision, it hardly influences the matter to be scattered thereby, which agrees with our intuition.

Since in silicon and germanium, the energy minimum point (the valence band highest point) of the hole is present at the point $\Gamma$, the hole hardly has the momentum. However, since the energy minimum point (the conduction band energy lowest point) of the electron is present close to a point X in the case of silicon, and is present at the point $\Gamma$ in the case of germanium, the electron has the large momentum.

Therefore, in silicon or germanium, in the process in which the electron and hole simply collide with each other, the conservation law of momentum, and the conservation law of energy cannot be met at the same time. Then, only a pair of electron and hole which have met the law of conservation of momentum and the conservation law of energy one way or another are converted into the light by, for example, absorbing or discharging the photon as the quantum of the lattice vibration in the crystal. Such a process can be physically present, but the probability of occurrence of the process is small because such process is a high-order scattering process such that the electron, the hole, and the photon collide with one another at a same time. Therefore, it is known that the luminous efficiency is extremely low in silicon or germanium as the indirect transition semiconductor.

By contrast, in most of direct transition compound semiconductors, the valence band highest energy and the conduction band lowest energy are each present at the point $\Gamma$. Therefore, the law of conservation of momentum, and the conservation law of energy can be both satisfied. Thus, the luminous efficiency is high in the compound semiconductor. A transistor laser element in which a laser using a compound semiconductor having the high luminous efficiency is driven by a bipolar transistor made of a compound semiconductor is reported in the following non-patent document 1.

It is known that although the luminous efficiency is extremely low in silicon in a bulk state as described, the luminous efficiency of silicon can be enhanced when in a porous state or a nanoparticle state. For example, silicon which has been anodized in a hydrofluoric acid solution is in the porous state, thereby emitting light at a room temperature and in a visible light wavelength band in the following non-patent document 2. Although the mechanics concerned is not perfectly elucidated, it is considered that a quantum size effect which is caused due to presence of silicon confined in a narrow region by formation of a porous silicon oxide is important. It is considered that since in silicon having the small size, the positions of the electrons is confined within the region concerned, and conversely, the momentum is not determined by the uncertainty principle of the quantum mechanics, thus making the recombination of the electron and hole easy to occur.

As another method using silicon, for example, it is described in the following non-patent document 3 that Er ions were implanted into a pn junction formed in a Si substrate, thereby making it possible to create a light-emitting diode (LED) becoming a light-emitting element. When the Er ions are implanted into the Si substrate, Er ions form impurity levels which are spatially localized. The momentum of the trapped electrons become effectively zero when the electrons present in the conduction band of Si are trapped in the impurity levels which the Er ions form. Thus, the electrons are able to be recombined with the holes in the valence band, thereby emitting the light. Since the light emission through the Er ions has a wavelength of 1.54 µm, the light could be propagated without being absorbed in surrounding silicon. In addition, this wavelength loses little when an existing optical fiber is used. Therefore, even when the Si-based LED using the Er ions is in practical use by the future technical innovation, the existing optical fiber network can be utilized. The Si-based LED is expected not to require a large scale equipment investment.

Moreover, as another method using silicon, for example, it is described in the following non-patent documents (4, 5) that Er ions were implanted into a silicon nanoparticle based on a combination of the quantum size effect described above, and an idea of the ER ion, whereby an efficiency was enhanced, thereby making it possible to carry out the light emission.

In the prior art described above, it was thought that for the purpose of making silicon emit light, to move the momentum away from a point of $k_0$ through the uncertainty principle by changing the band structure of the conduction band of silicon to the band structure of the bulk, it was only necessary to make silicon become a porous state, a nanoparticle state or the like by the quantum size effect. However, there is a problem that if, for example, silicon having such a structure as the nanoparticle is formed, then, a surface of the silicon nanoparticle is oxidized to form a silicon dioxide on the surface due to the feature that a silicon surface is extremely easy to oxidize. Since the silicon dioxide is an insulator which is extremely large in band gap, there is caused a problem that if the silicon dioxide is formed on the surface, then, the electrons or the holes cannot be efficiently implanted. Therefore, in the conventional light-emitting element, there is a problem that even if a high intensity is obtained in photoluminescence, the efficiency is extremely reduced in electroluminescence. In addition, during the light emission, the crystallinity of the matter becoming the light-emitting layer becomes important. However, in the nanoparticle formed by a Chemical Vapor Deposition (CVD) or in the structure in which a large number of irregular holes are opened by the anodic oxidation, there is a problem that its crystallinity is lower compared to the single crystal. With low crystallinity, the light emission through defect levels is generated. However, in the light emission utilizing the defects, there is a problem that with low crystallinity it is impossible to manufacture the element which withstands actual use such as the information communication.

As has been described, although the effort for making silicon emit light has been made by the various techniques such as porous silicon, the nanoparticle, and the Er doping, the luminous efficiency has not so high as to reach the practical level.

We reported that a light-emitting element includes a first electrode portion into which electrons are implanted, a second electrode portion into which holes are implanted, and an a light-emitting portion electrically connected to the first electrode portion and the second electrode portion; the light-emitting portion is made of a single crystal silicon; and the light-emitting portion has a first surface (upper surface) and a second surface (lower surface) facing the first surface. Also, in this case, we reported that a plain orientation of each of the first and second surfaces is made a (001) plane, and a thickness of the light-emitting portion in a direction perpendicular to the first and second surfaces is thinned, thereby obtaining the light-emitting element which can be readily formed on a substrate such as silicon by using a normal silicon process, and which emits light at a high efficiency (the following PTL 1). For this, it is possible to understand that when the electrons are confined in the extremely narrow region represented by a extremely thin single crystal silicon film or the like, in the electron state of the bulk, even in the case of the matter like silicon in which the electrons in the conduction band are absent in the point Γ, the electrons cannot carry out motion effectively in the vertical direction of the thin film. This shows qualitatively a matter of cause that since the direction vertical to the thin film becomes absent, the electrons cannot be moved in the direction vertical to the thin film. That is to say, it is thought that even in the case of an ultra-decrease in film of silicon, in the bulk, the indirect transition semiconductor effectively turns into the direct transition semiconductor by the quantum confinement effect (two-dimensional confinement effect). Hereinafter, the principles of the light emission and the demonstration result thereof will be shown.

A description will now be given with respect to the principles for making a Group IV semiconductor such as silicon and germanium following the same efficiently emit light. A wave function $\psi(r)$ representing the state of the electrons in the crystal such as silicon can be expressed like (Expression 1) in extremely high approximation.

[Expression 1]

$$\psi(r) = \Phi_{k_0}(r)\xi(r) \qquad (1)$$

Here, $k_0$ is a momentum giving a valley of a band of a conduction band, r=(x, y, z) represents a position on a space, $\Phi_{k_0}(r)$ gives a Bloch function in the valley of the band of the conduction band, and $\xi(r)$ represents an envelope function, $\Phi_{k_0}(r)$ is expressed as (Expression 2) by using a periodic function $u_{k_0}(r+a)=u_{k_0}(r)$ reflecting the periodicity for a unit lattice vector "a" in a crystal.

[Expression 2]

$$\Phi_{k_0}(r) = u_{k_0}(r)e^{ik_0 r} \qquad (2)$$

As apparent from this as well, the wave function $\psi(r)$ violently vibrates as a function of a distance of an atomic-scale distance. In contrast, the envelope function $\xi(r)$ represents a component which exhibits a gentle change in the atomic scale, and represents a response to the physical shape of the semiconductor and the external field which is applied from the circumferences. When a thought is made including a case where $\psi(r)$ is the wave function in the semiconductor structure which is not necessarily the bulk crystal, but has the finite size, Expression which $\xi(r)$ should meet can be derived as Expression (3).

[Expression 3]

$$[\epsilon(k_0 - i\nabla) + V(r)]\xi(r) = E\xi(r) \qquad (3)$$

Here, $\epsilon = \epsilon(k)$ represents a band structure in bulk of a conduction band electrode having a movement k, and a term which is obtained by substituting a sum of a differential vector $-i\nabla$, and a momentum $k_0$ into the momentum k is represented in the form of $\epsilon(k_0 - i\nabla)$. In addition, V=V(r) is a potential which the electron feels. For example, when an insulator or another kind of semiconductor contacts a boundary portion of a semiconductor, V=V(r) gives a potential barrier. Also, an electric field is applied from the outside by an electric field effect, thereby making it also possible to adjust a value of V=V(r). For the sake of the simplicity here, attention is paid only to the change for the z direction of V.

In order to facilitate the understanding, specifically, supposing silicon on a (001) plane as the semiconductor as the semiconductor, as has been described, in the bulk, the valley of the conduction band existing in $(0, 0, \pm k_0)$ in a $k_z$ direction can be approximated as (Expression 4).

[Expression 4]

$$\varepsilon(k) = \frac{\hbar^2}{2m_t^*}(k_x^2 + k_y^2) + \frac{\hbar^2}{2m_l^*}(k_z \mp k_0)^2 \qquad (4)$$

Here, $m^*_t$ and $m^*_l$ represent effective masses in a silicon crystal which are respectively obtained from curvatures in short axis and long axis directions of the valley of the conduction band having a spheroidal shape. Then, Expression (3) is expressed as Expression (5).

[Expression 5]

$$\left[-\frac{\hbar^2}{2m_t^*}(\partial_x^2 + \partial_y^2) - \frac{\hbar^2}{2m_l^*}\partial_z^2 + V(r)\right]\xi(r) = E\xi(r) \qquad (5)$$

It is noted that letting (x, y) be the direction parallel with the (001) plane, w be a width, L be a length, and setting an envelope function as (Expression 6), (Expression 5) is simplified to (Expression 7).

[Expression 6]

$$\xi(r) = \frac{e^{i(k_x x + k_y y)}}{\sqrt{LW}}\chi(z) \qquad (6)$$

[Expression 7]

$$\left[-\frac{\hbar^2}{2m_l^*}\partial_z^2 + V(z)\right]\chi(z) = \Delta E \chi(z) \qquad (7)$$

Here, ΔE represents an energy in the z direction and an entire energy of the electron measured from a bottom of the conduction band is expressed by (Expression 8).

[Expression 8]

$$E = \frac{\hbar^2 k_x^2}{2m_t^*} + \frac{\hbar^2 k_y^2}{2m_t^*} + \Delta E \qquad (8)$$

Firstly, it should be confirmed that (Expression 7) reproduces the electron state of the bulk. To that end, it is only necessary to obtain a solution of a continuous state when V(r)=0 is set. This is confirmed from that when letting t be a thickness of the z direction, the envelope wave function becomes (Expression 9), and ΔE becomes (Expression 10).

[Expression 9]

$$\chi(z) = \frac{1}{\sqrt{t}}e^{ik_z z} \qquad (9)$$

-continued

[Expression 10]

$$\Delta E = \frac{\hbar^2 (k_z \mp k_0)^2}{2m_l^*} \quad (10)$$

That is to say, the wave function violently vibrates in a state in which it continuously spreads over the entire bulk crystal. At this time, it goes without saying that when letting $k_z$ be a momentum operator in the z direction, a quantum-mechanical expected value of the momentum in the z direction becomes (Expression 11).

[Expression 11]

$$\langle \hat{k}_z \rangle = \int d^3 r \psi^*(r)(-i\partial_z)\psi(r) \quad (11)$$
$$= k_z \pm k_0$$

That is to say, it is shown from the mathematical expression as well that in the indirect transition semiconductor such as silicon, since the probability that many electrons are present in points far away from the point Γ in the momentum space is predominantly high, they move with having greatly large momentums. The present invention uses the fact that in the case of the ultra-thin film in which t as the thickness in the z direction is greatly small, in the bulk, the indirect transition semiconductor effectively turns into the direct transition by the quantum confinement effect as the basic principles. Hereinafter, this respect will be described in detail.

To describe a story in a simplified manner, continuously, it is supposed that in a state of giving silicon as an example, silicon in which a thickness t in the z direction is greatly small vertically, adjacently contacts an insulator such as $SiO_2$ having a large band gap or the vacuum or the atmosphere having a larger energy gap vertically in the z direction. As a system for which the same effect can be expected, for example, if the electrons are confined within the narrow region by the electric field effect or the like, then, the same effect can be expected. In these cases, the wave function of the electron in silicon becomes zero in a vertical interface in the z direction. Of course, strictly, the ooze of the quantum-mechanical wave function is preset. However, since the energy barrier is large, the ooze is exponentially reduced to the distance in the z direction. Hence, the approximation that the wave function becomes zero in the interface is approximately strictly true. Therefore, even if the potential V(r) which is applied from the outside is zero, then, the situation of the envelope wave function is different from the case where t is thick at all. Actually, the envelope wave function of the electrons and holes which are confined within such a quantum well are solved as (Expression 12) in the case of an even number: n=0, 2, 4, . . . where n is an index representing a discrete energy level, and become (Expression 13) in the case of an odd number: n=1, 3, 5, . . . . Thus, a value of the energy level can be expressed as (Expression 14) irrespective of whether n is an even number or an odd number.

[Expression 12]

$$\chi_n(z) = \sqrt{\frac{2}{t}} \cos\left(\pi \frac{z}{t}(n+1)\right) \quad (12)$$

[Expression 13]

$$\chi_n(z) = \sqrt{\frac{2}{t}} \sin\left(\pi \frac{z}{t}(n+1)\right) \quad (13)$$

[Expression 14]

$$\Delta E = \frac{\hbar^2}{2m_l^*} \frac{\pi^2}{t^2} (n+1)^2 \quad (14)$$

It goes without saying that the state in which the energy is lowest is n=0. In showing the envelope wave function, it was supposed that the origin of the z-axis was set at the center of the thin film silicon, and the interface having the high energy barrier was present in z=±t/2. Here, a description will be given with respect to the property of the envelope wave function $\chi_n(z)$. When n is either 0 or an even number, the envelope wave function is symmetrical with respect to a sign change of z, and has the property of $\chi_n(z)=\chi_n(-z)$. This is the as that parity is even. On the other hand, when n is an odd number, the envelope wave function has the property of $\chi_n(z)=-\chi_n(-z)$. This is the as that parity is odd.

Since the envelope wave function has such a structure that the symmetry is reflected, when the contribution to the momentum by the envelope wave function is evaluated, (Expression 15) is obtained.

[Expression 15]

$$\langle \chi_n | \hat{k}_z | \chi_n \rangle = \int dz \chi_n^*(z)(-i\partial_z)\chi_n(z) \quad (15)$$
$$= 0$$

This has the extremely common property that since when $\chi_n(z)$ is differentiated with the z direction, the parity is changed to the parity which $\chi_n(z)$ originally has, when $\chi_n(z)$ is integrated with the z direction, it becomes zero. In a word, it is understood that there is the property in which since the electron is strongly restricted in the z direction, the envelope wave function becomes a standing wave, and thus the electron stops moving. This completely contracts with that the envelope wave function in the bulk state has an exponential form as given by (Expression 9), and the electron moves around the entire bulk crystal with the momentum. However, the full wave function for which up to the presence of the Bloch function is taken into consideration is obtained by substituting (Expression 2), (Expression 6), and (Expression 13) or (Expression 14) into the (Expression 1). Therefore, it is necessary to pay attention to that the quantum-mechanical expected value of the momentum in the z direction becomes (Expression 16).

[Expression 16]

$$\langle \hat{k}_z \rangle = \int d^3 r \psi^*(r)(-i\partial_z)\psi(r) \quad (16)$$
$$= \pm k_0$$

In a word, when the envelope wave function is the bulk as the original property of the semiconductor material, since the valley of the conduction band is not present in the point Γ, but the valley is present at $(0, 0, \pm k_0)$, the overall wave function reflects the property thereof. When the property is viewed in such a manner, even in the thin film the electron seems to be moving around with having the momentum $\pm k_0$, yet we take note that attention needs to be paid to this. In a word, for example, in the matter having the reversal symmetry in terms of the crystal like silicon, attention needs to be paid to that the valley $(0, 0, +k_0)$ and the valley of $(0, 0, -k_0)$ are equal in energy to each other, and thus the regeneration is caused. When the quantum-mechanical states having the energy levels which are extremely generally regenerated are confined within the spatially same region, hybrid is generated among these states. In a word, if the energy band which couples the valley $(0, 0, +k_0)$ and the valley of $(0, 0, -k_0)$ is extremely slightly present, two discrete levels form the bonding orbital and the anti-bonding orbital. For example, it would be thought that the coulomb interaction or the like between the electrons, which is not sufficiently contained in the band calculation, strongly acts between the electrons confined within the narrow region. The interaction acting between the electrons is called the electron correlation, and becomes a large problem in many transition metallic oxides including the high-temperature super-conduction. However, the interaction has not been the large problem in the bulk silicon until now by reflecting that the sp orbital in the original silicon atom has the large orbital. However, when the electrons are confined in such an extremely narrow region that the quantum-mechanical effect becomes important, since the coulomb interaction strongly acts on such a case, it will be impossible to disregard such a coulomb interaction between the electrons. If the coulomb interaction is taken in the proper way, and the matrix elements of Hamiltonian are calculated, then, the hybrid which couples the valley $(0, 0, +k_0)$ and the valley of $(0, 0, -k_0)$ is present therein. Also, if the Hamiltonian is diagonalized, then, it is understood that the Hamiltonian is divided into the bonding orbital and the anti-bonding orbital. This is similar to a process in which a hydrogen molecule is formed when two hydrogen atoms are brought close to each other. A method of evaluating such a system has been understood for about 70 years when the quantum mechanics was formed by Heitler-London. We firstly took note that the formation of the bonding state understood by Heitler-London is important in the coupling as well of the valleys even in the case where a Group IV semiconductor such as silicon is confined within the narrow region. In addition, even if such energetical bonding is not present at all, the standing wave which is not moving in the z-axis direction can be structured from unitary transformation of two states. This will now be described in more detail. The Bloch state has the property of $u_{-k0}(r)=u_{k0}(r)$ from the reversal symmetry which the crystal has. Therefore, the Bloch wave functions of the valley $(0, 0, +k_0)$ and the valley of $(0, 0, -k_0)$ are expressed in the form of $\Phi_{k0}(r)=u_{k0}(r)e^{ik0z}$, and $\Phi_{-k0}(r)=u_{k0}(r)e^{-ik0z}$, respectively. Therefore, it is understood that it is only necessary to pay attention to a portion of $e^{\pm ik0z}$. In order to structure the new ground state from the sum of and difference between those wave functions, it is only necessary to make the transformation to (Expression 17) by the unitary transformation.

[Expression 17]

$$U\begin{pmatrix} e^{ik_0z} \\ e^{-ik_0z} \end{pmatrix} = \frac{1}{\sqrt{2}}\begin{pmatrix} 1 & 1 \\ -i & i \end{pmatrix}\begin{pmatrix} e^{ik_0z} \\ e^{-ik_0z} \end{pmatrix} \qquad (5)$$

$$= \sqrt{2}\begin{pmatrix} \cos(k_0z) \\ \sin(k_0z) \end{pmatrix}$$

Therefore, it is understood that the change in the wave function at the atomic level can be described by the wave function of two standing waves of $2^{1/2}u_{k0}(r)\cos(k_{0z})$ and $2^{1/2}u_{k0}(r)\sin(k_{0z})$. Also, when the entire wave functions are shown, they can be expressed by (Expression 18) and (Expression 19), respectively.

[Expression 18]

$$\psi(r) = \sqrt{2}\, u_{k_0}(r)\cos(k_0z)\xi(z) \qquad (18)$$

[Expression 19]

$$\psi(r) = \sqrt{2}\, u_{k_0}(r)\sin(k_0z)\xi(z) \qquad (19)$$

The expected value in the z-axis direction of the momentum in the state of either (Expression 18) or (Expression 19) becomes (Expression 20) by reflecting that the wave function expected value is the standing wave.

[Expression 20]

$$\langle \hat{k}_z \rangle = \int dz \psi^*(z)(-i\partial_z)\psi(z) \qquad (20)$$
$$= 0$$

In a word, it is understood that the electron is not moving in the z direction at all. Since misunderstanding may occur in that only by changing the ground, the expected value of the momentum appears to be changing, and thus attention is paid thereto. In reality, the ground wave functions such as (Expression 18) and (Expression 19) are not eigenstate of the momentum. That is to say, the matrix element of the momentum operator becomes (Expression 21) when (Expression 18) and (Expression 19) are used, Diagonal matrix elements each becomes zero, and thus off-diagonal matrix elements become pure impurity members.

[Expression 21]

$$U\begin{pmatrix} k_0 & 0 \\ 0 & -k_0 \end{pmatrix}U^{-1} = \begin{pmatrix} 0 & ik_0 \\ -ik_0 & 0 \end{pmatrix} \qquad (21)$$

Whether taking such a ground is physically suitable depends on the property of the system as an object. We assume the ultra-thin single crystal silicon film; however, since in such a case, the translation symmetry for the z-axis direction is crumbling, it is suitable to use $\sqrt{2}u_{k0}(r)\cos(k_{0z})$ or $\sqrt{2}u_{k0}(r)\sin(k_{0z})$ becoming the standing wave rather than to use $u_{k0}(r)e^{\pm ik0z}$ as the eigenstate of the momentum. Contrary to this, when the bulk state is handled, since the translation symmetry is present, it is better to use $u_{k0}(r)e^{\pm ik0z}$. In addition, in the bulk state, the electron having the momentum of $\pm k_0$ violently moves around within the crystal. In this case, the electron is strongly scattered by the phonon or the like that is the quantum of the lattice vibration in the crystal, and the phase of the wave function has changed dynamically. Therefore, it is impossible to expect that a state in which the state of the momentum of $+k_0$, and the state of the momentum of $-k_0$ are coherently coupled is formed. By contrast to this, when the ultra-thin single crystal silicon film or the like, the electron is confined in such an extremely narrow region as to be thinner than a mean free path l as a length characterizing the scattering, even at the room temperature, the wave function sufficiently can form the standing wave in which the phase is determined. Qualitatively, this means that while the wave of the electron moves in and out the narrow region, the wave concerned becomes a steady wave which perfectly fits the size of that region.

As given a detailed description above by using the simple mathematical expressions, it is understood that when the electron is confined in the extremely narrow region represented by the ultra-thin single crystal silicon film or the like, in the electron state in the bulk, even in the case of the matter like silicon in which the electron in the conduction band is not present at the point $\Gamma$, the electron does not effectively move in the direction vertical to the thin film. Qualitatively, this shows a matter of course in which the electron cannot move in the direction vertical to the thin film since the direction vertical to the thin film is absent. In a word, this means that even if the electron moves in the crystal at the high speed in the bulk, since the direction in which the electron should move becomes absent in the first place in the thin film, the electron is compelled to stop.

Since the movement in the z-axis direction comes to be unable to be carried out, the band structure of the bulk is projected onto the plane of $k_z=0$ to become a two-dimensional band structure. The system which is confined in the two-dimension in such a manner is called a two-dimensional electron system. In addition, if the thin film is not formed, but the ultra-fine line structure like a nanowire is formed, then, the dimension is further reduced, thereby making it possible to form one-dimensional electron system as well. In the thin film, the conduction band lowest energy point of $(0, 0, \pm k_0)$ in the three-dimensional band structure of the bulk is projected onto the point $\Gamma$ in the two-dimensional band structure.

We have reached an idea that the electron present at the point $\Gamma$ of the two-dimensional band structure is efficiently recombined with the hole, and is ought to be used as the light-emitting element. In a word, the electron is confined, whereby the electron cannot freely move. Therefore, when the electron collides with the hole which has the small momentum because it is similarly present at the point $\Gamma$, the light which also has the small momentum can be discharged without breaking the law of conservation of the momentum and the law of conservation of energy. As described above, the momentum is the scale showing how much impact the particle is scattered when the particle collides with another particle. We took note that if the electron is confined in the narrow region to be unable to move, then, the momentum of the electron is lost. If the momentum of the electron becomes small, then, the law of conversation of momentum during the scattering which has been difficult with the conventional method comes to be able to hold. Therefore, even the Group IV semiconductor such as silicon efficiently emits light.

In the examples so far, in the case of silicon, since the conduction band lowest point in the vicinity of the point X in the bulk is projected onto the two-dimensional point $\Gamma$, the thin film needs to take such a crystal orientation that the (001) plane becomes the surface of the film. In the case of germanium, since the conduction band lowest point is present at the point $\Gamma$, in order to obtain the same effect, a (111) plane needs to become the surface of the film.

However, although germanium is the same indirect transition semiconductor as silicon, germanium is different from silicon in that not only the energy of the conduction band becomes lowest at the point L, but also the minimum point of the energy is present at the point $\Gamma$. Since an energy difference between the point $\Gamma$ and the point L is about 0.14 eV, if a large amount of electrons are implanted, then, after the point k in the vicinity of the point L is met, the electrons can also be implanted into the point $\Gamma$. For this reason, in the light emission by the direct transition in the germanium thin film, there are two cases. In the first case, the electron at the conduction band lowest point which is derived from the point L and which is projected onto the point $\Gamma$ gets involved in the light emission. In the second case, the electron at the minimum point of the conduction band which has been originally present from the phase of the bulk gets involved in the light emission. With regard to the matrix elements of the optical transition with the valence band maximum point, the conduction band minimum point derived from the point $\Gamma$ is much larger than the conduction band lowest point derived from the point L. Therefore, if the electron implantation can be sufficiently carried out, then, the luminous efficiency is better in the case where the minimum point derived from the point $\Gamma$ is utilized than in the other cases. However, since a necessary amount of implanted electrons is not small, this is not simple. Accordingly, which to positively use the lowest point derived from the point L or the minimum point derived from the point $\Gamma$ to easily increase the luminous efficiency depends on the thickness of the thin film, the structure of the interface, the structure of the device, and the like, depending on the situation.

The PTL 2 based on the element structure of PTL 1 also shows the element structure in which the silicon thin films are arranged in fins at intervals each of which is at half the light emission wavelength $\lambda$, and which are combined with the waveguide is shown for the purpose of efficiently utilizing the silicon thin film as the light source of the silicon laser. Two methods are shown for manufacturing the fin-like structure. In the first method, after a fine line pattern is drawn on a mask, etching is deeply carried out. In the second method, after a silicon layer and a silicon-germanium layer are alternately laminated by using an MBE method, a silicon-germanium layer is selectively etched away, thereby leaving only a fin-like silicon layer.

It is shown in PTL 3 that a method of carrying out compression in a (001) direction of a silicon crystal, that is, in a direction vertical to a surface of a thin film is effective as a method of enhancing a luminous efficiency in the structure of PTLs (1, 2). When such compression that a volume is contracted by 2% is carried out, a pressure is about 1.5 Gp, and the luminous efficiency increases by from about 10% to about 30%. The reason why there is a width in the increase in the luminous efficiency is because the degree of the change differs depending on the thickness (the number of atomic layers). That effect is effective in the silicon thin film as well having a film thickness, which is capable of being readily formed, of about 30 atomic layers. Therefore, this effect is easy to utilize in enhancement of the efficiency of the light emitting element based on the silicon (001) thin film.

A description will now be given with respect to the double hetero-structure of the semiconductor laser which is previously realized in the general Group III-V compound semiconductor. Even in the Group III-V semiconductor which is relatively high in luminous efficiency, only by connecting a positive electrode and a negative electrode with the material left as is to implant the electrons and holes from the both sides, the electron and hole which did not collide with each other, did not emit light, and did not disappear reach the opposite-side electrode with the electron and hole passing each other without emitting the light to be absorbed therein, and thus the efficiency is low. Then, regions each having a large band gap than that of a light-emitting region are formed on both sides (on a positive side and a negative side) of the light-emitting region by using a technique such as epitaxial growth. As a result, this provides such a structure as to be an energy barrier for the holes and electrons. A semiconductor a band gap of which is originally larger than that of a semiconductor of the light-emitting region is used in the portion to be the barrier layer. This is called the double hetero-structure. The electron an the hole which have been implanted into the light-emitting region cannot go beyond the energy barrier by the double hetero-structure to be confined within the light-emitting region. Thus, the probability that the light is emitted increases because in the interim, the electron and hole are recombined with each other.

CITATION LIST

Patent Literature

PTL 1: Japanese Patent Laid-open No. 2007-294628
PTL 2: Japanese Patent Laid-open No. 2008-205006
PTL 3: Japanese Patent Laid-open No. 2010-238722

Non-Patent Documents

Non-patent document 1: R. Chan, M. Feng, N. Holonyak, Jr., A. James, and G. Walter, Applied Physics Letters (Appl. Phys. Lett.), 2006, Vol. 88, pp. 143508-1 to 143508-3
Non-patent document 2: L. T. Canham, Applied Physics Letters (Appl. Phys. Lett.), 1990, Vol. 57, pp. 1046 to 1048
Non-patent document 3: S. Coffa, G. Franzo, and F. Priole, Applied Physics Letters (Appl. Phys. Lett.), 1996, Vol. 69, pp. 2077 to 2079
Non-patent document 4: F. Iacona, G. Franzo, E. C. Moreira, and F. Priolo, Journal of Applied Physics (J. Appl. Phys.), 2001, Vol. 89, pp. 8354 to 8356
Non-patent document 5: S. Coffa, IEEE Spectrum, 2005, Oct. pp. 44 to 49
Non-patent document 6: A. W. Fang, H. Park, R. Jones, O. Cohen, M. J. Paniccia, J. E. Bowers, IEEE Photonics Technology Letters, 2006, Vol. 18, pp. 1143 to 1145

SUMMARY OF INVENTION

Technical Problem

In the inventions of PTL 1 and PTL 2 described above, the light-emitting element is provided which can cause electroluminescence by implanting the electrons and holes into the ultra-thin film of silicon. In addition, in PTL 3, the method of enhancing the luminous efficiency of that light-emitting element is provided. However, the luminous efficiency of the light-emitting region is still smaller than the luminous efficiency of the Group III-V semiconductor such as GaAs. For manufacturing the laser by using such a material, the luminous efficiency which is not high needs to be fully utilized.

To that end, it is necessary to make a structure for confining the electron and hole within the light-emitting region similarly to the double hetero-structure using a Group III-V semiconductor. If the luminous efficiency is enhanced by such a structure, then, this is preferable because room in a design increases, and the degree of freedom of a design increases too. Even when such a structure is utilized as the light-emitting element which is not the laser, such a structure is useful in enhancing the luminous efficiency. However, in the conventional form of a semiconductor laser, by the technique of the epitaxial growth, the thickness was controlled so as to be uniform in the plane direction parallel with the substrate, and with an nm size in the direction vertical to the substrate, whereby it was possible to form the barrier region having a suitable size. However, in the element in which the current is injected from the side along the thin film like PTLs (1, 2), only the fine structure control for the direction in which the stacking is carried out vertically with respect to the substrate is not enough. Thus, the pattern having the nm size needs to be drawn in the direction as well parallel with the plane. Therefore, the barrier region cannot be formed with the conventional method. Since this thin film has the extremely thin ultra-fine structure, in order to further add the fine structure said as the barrier region without destroying the extremely thin ultra-fine structure, it is necessary to pay attention to the prevention of the unnecessary oxidation, the temperature management for preventing the fine structure from being destroyed, the exclusion of the impurity, and the like. Thus, the technique which can be applied is limited. For this reason, the barrier structure itself needs to be reviewed, and thus the confinement of the carriers (electron and hole) which is different from the conventional one needs to be realized with the realizable method.

The present invention provides an element structure for carrier confinement which can be applied to the structure of the light-emitting element of PTLs (1, 2), and which corresponds to the double hetero-structure, and a method of manufacturing the same.

Solution to Problem

For the purpose of obtaining the same effects as those in the case where semiconductors each having a wide band gap are disposed on both sides of a positive side and a negative side of a light-emitting region, a one-dimensional quantum confinement region is formed instead of such a semiconductor.

When the electron or the hole is confined within a narrow space, energy increases by the quantum confinement effect. Since the light-emitting region of the light-emitting element described in PTLs (1, 2) has the shape of the thin film, the carriers are previously present in the two-dimensional quantum confinement region all the more. When the direction vertical to the surface of the film is set as the z direction, the carriers within the thin film are confined in the well type potential in the z direction, and the energy thereof climbs as compared with the phase of the bulk and is expressed by (Expression 14). Although n is an integral number equal to or larger than 0, it is understood that even in the state of the lowest energy of n=0, an amount of energy climb is not zero, and climbs as the thickness t of the thin film is thinner. By the quantum confinement, the energy at the conduction band lower end into which the electrons are implanted climbs, while the energy at the valence band upper end into which the holes are implanted declines. The hole means the state in which the electron is not filled. When the movement of the hole is discussed, it is only necessary to make a discussion by reversing positive and negative in the expression expressed by the energy of the electron. Therefore, the energy climb by the quantum confinement of the holes appears in the form of the decline of the valence band upper end. Thus, as compared with the case of the bulk, as a result of the quantum confinement to the two dimensions, the film is previously in a state in which the band gap is opened. In this connection, the emission wavelength can also be adjusted by controlling the film thickness by utilizing this fact.

As a method of further forming the structure having the wider band gap on the both sides of such a thin film structure, the connection portion to the electrodes, there is a method of forming one-dimensional quantum confinement region by narrowing the path through which the carriers are caused to flow. When it is supposed that the thin film is parallel with an xy plane, and a positive electrode and a negative electrode are disposed in the x-axis direction (the current flows along the x-axis), by sufficiently narrowing a width in the y direction, the narrow portion concerned becomes a region in which the quantum confinement is one-dimensionally carried out. By the new quantum confinement in the y direction, the band gap is further opened depending on the width in the y direction. Therefore, the one-dimensional quantum confinement region becomes a band gap extended region and functions as the barrier region.

When the thin film of the light-emitting region is formed in the light-emitting element of PTLs (1, 2), the region in which the semiconductor was to be oxidized is limited by the etching or the like. Thereafter, the oxidation was carried out while an amount of oxidation was sufficiently controlled, whereby the semiconductor portion was finally left so as to have the objective shape of the thin film. The oxidation is carried out by using the same technique, thereby making it possible to form the one-dimensional quantum confinement region. The oxidation process for causing the thickness of the thin film to be a predetermined thickness, and the oxidation process for causing the width of the one-dimensional confinement region to be a predetermined thickness may be the same process or may be the different processes.

Since the exactly same technique as that for the formation of the thin film is used, the technical precision is high, and the formation of the fine structure is possible, which results in that a new problem is not caused in terms of the temperature, the impurity, and the like. Since the one-dimensional confinement region is formed as the barrier region, the cross section through which the current flows is smaller in that region than in the thin film region. For this reason, an electric resistance as the entire element is large. In order to reduce the shortcoming even a little, it is better that the length of the barrier region is shortened as much as possible. If the current flows in the x-axis direction, reducing the width in the x direction of the barrier region as much as possible leads to that an increase in the electric resistance is reduced as much as possible. In a word, such a structure as to be connected to the electrode by the long one-dimensional fine line is not preferable, and the shorter the one-dimensional region is, the better. To that end, for example, circular holes are bored in the y direction side by side in the thin film so that the gap between the adjacent two holes becomes the one-dimensional confinement region. When such a structure is adopted, the one-dimensional confinement region having the narrowest width lies only on the straight line which links the centers of the adjacent circles, and thus is smaller than the width of one hole.

In addition, when the light-emitting region is a thick film having a thickness of 5 nm or more, or a bulk germanium, even not the one-dimensional confinement region, but the two-dimensional confinement region, that is, even the film thickness having the thickness of 5 nm or less as the barrier region, the same effects can be expected.

Advantageous Effects of Invention

According to the present invention, it is possible to inexpensively provide the light-emitting element which is higher in the luminous efficiency of the silicon light-emitting element or germanium light-emitting element which can be readily formed on the substrate of silicon or the like. In addition, likewise, it is possible to inexpensively provide the light-emitting element in which the degree of freedom of the design is increased by the stronger light emission source of the silicon laser or the germanium laser which can be readily formed on the substrate of silicon or the like.

DESCRIPTION OF EMBODIMENTS

Example 1

There will be shown a method in which holes are bored on the both ends of the light-emitting region of the silicon thin film light-emitting element of PTL 1 to form the barrier region for the carriers, thereby obtaining the same effects as those in the double hetero-structure.

Figure 1:
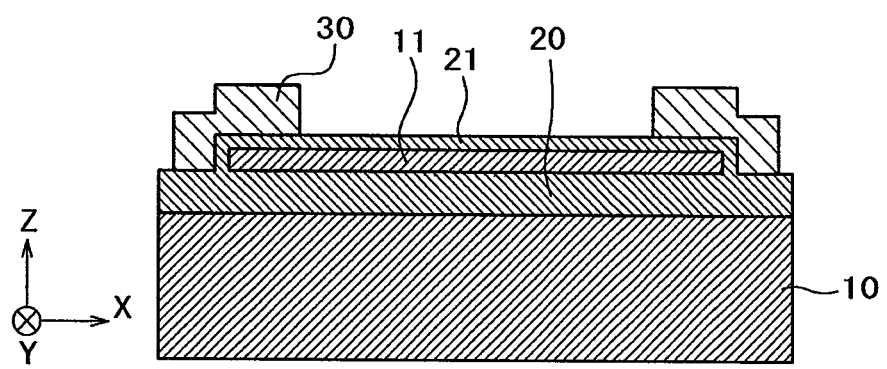
FIG. 1 is an element cross-sectional schematic view explaining a process for manufacturing an integrated light-emitting element of Example 1 according to the present invention.

FIG. 1 is a schematic cross-sectional view in an xy plane of the structure in the middle of manufacture of the silicon thin film light-emitting element. Suppose that a direction vertical to a surface of a silicon supporting substrate 10 and a silicon thin film 11 is set as a z direction, and a direction (a horizontal direction in the figure) in which a current flows through the silicon thin film after completion is set as an x direction. Also, suppose that a depth direction vertical to the paper is set as a y direction. All of figures including this figure are schematic views and ratios in size, and horizontal to vertical ratios in respective regions are different from those in an actual case.

Firstly, a silicon oxide film 20 having a thickness of 1 μm is stacked on the silicon supporting substrate 10, and a single crystal silicon thin film 11 having a thickness of 100 nm is formed on the silicon oxide film. A silicon oxide film 21 is formed on the single crystal silicon thin film 11 through natural oxidation. A silicon nitride layer 30 is formed on silicon oxide film 21 by etching, and covers and protects a portion other than a portion which will be subjected to thermal oxidation in a next process. It is noted that although the effects of the natural oxidation, the thermal oxidation, the nitride formation, and the like appear on a backside (on a lower side of the figure) of the silicon substrate on which a light-emitting region is not formed, these depictions are all omitted in all of the figures.

Figure 2:
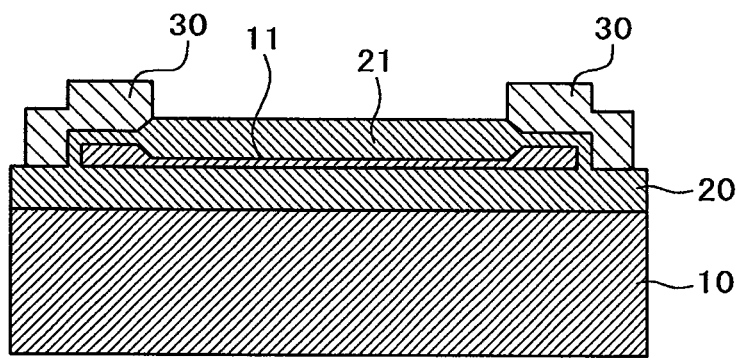
FIG. 2 is an element cross-sectional schematic view explaining a process for manufacturing the integrated light-emitting element of Example 1 according to the present invention.

FIG. 2 shows a state in which the silicon thin film 11 is processed in thickness from 1 nm to a predetermined thinness of 5 nm by the thermal oxidation. At this time, the silicon thin film 11 is oxidized to be thin, and the silicon oxide film layer 21 becomes thick. Silicon in the regions of both ends which is protected by the silicon nitride is left at the original thickness without being thinned.

Figure 3:
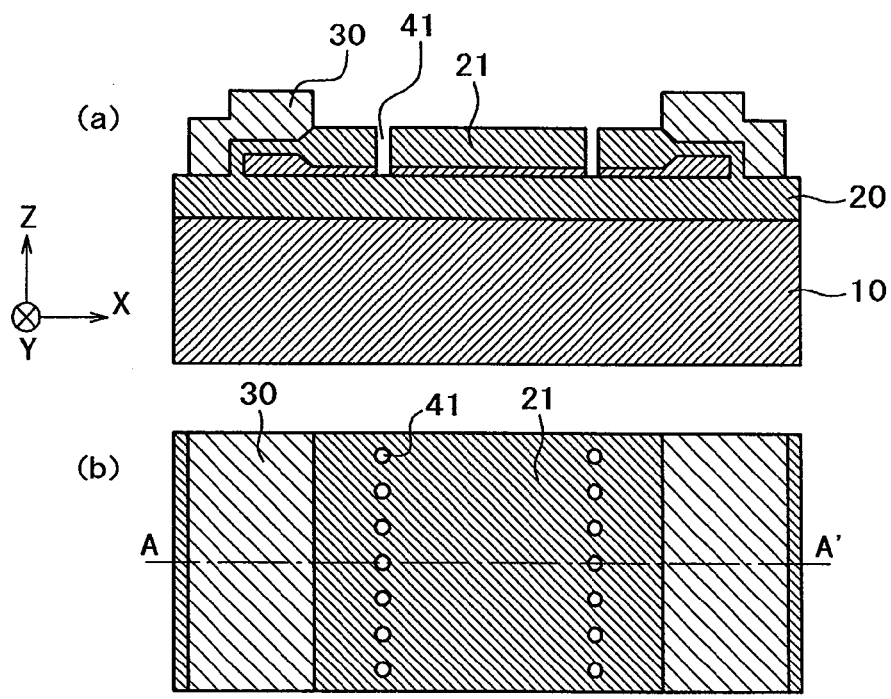
FIG. 3(a) is an element cross-sectional view explaining a process for manufacturing the integrated light-emitting element of Example 1 according to the present invention.
FIG. 3(b) is an element plane schematic view thereof.

FIG. 3 shows a structure in which holes 41 are bored in predetermined positions of the silicon oxide film 21 and the silicon thin film 11 by dry etching. The lower half of the figure is a top plan view when this element is viewed from the above in the z direction. Also, a cross-sectional view on line A-A' corresponds to the upper half of the figure. The holes are bored side by side at equal intervals in the y direction. Now, a facing distance between the holes 41 which are formed in line in the vicinity of the left-hand side electrode in the figure and the holes 41 which are formed in line in the vicinity of the right-hand side electrode in the figure so as to be opposite thereto is normally set to approximately 1 μm.

Figure 4:
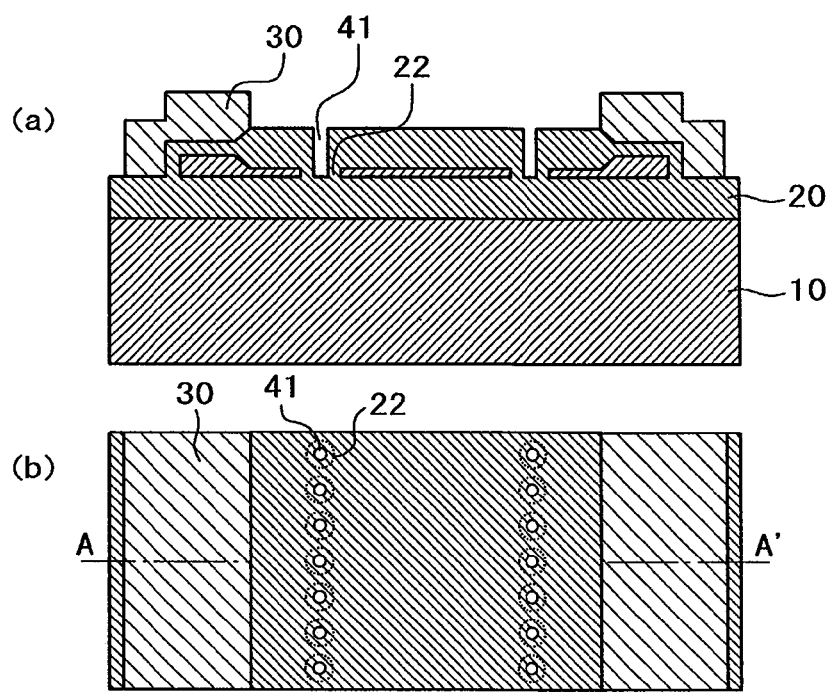
FIG. 4(a) is an element cross-sectional view explaining a process for manufacturing the integrated light-emitting element of Example 1 according to the present invention.
FIG. 4(b) is an element plane schematic view thereof.

FIG. 4 shows a state in which the holes 41 bored in the silicon thin film 11 are enlarged by carrying out wet etching to be made larger holes 22. As a result, a path for carriers which includes a silicon crystal portion between the hole 22 and the hole 22 becomes narrower. An amount of wet etching is adjusted in such a way that this width becomes from 1 nm to a predetermined width of 10 nm. This narrowed portion is a one-dimensional quantum confinement region, and becomes a barrier region for the carriers. A lower limit value of the predetermined width described above is determined from an aspect of a resistance for the current which flows in the x direction. Also, an upper limit thereof is determined from an aspect of a quantum confinement effect.

It is noted that a structure is adopted in which the size of the final hole 22 is made small as much as possible, and thus a large number of holes per unit length in the y direction (in the direction in which the holes get in a line in FIG. 4) are bored all the more leads to that the number of paths for the carriers increases to reduce the electric resistance. This is desirable. Normally, it is hard to control a hole-to-hole distance to a predetermined width in a range of 1 nm to 10 nm only by carrying out dry etching. Therefore, there are required two stages of processes: firstly, the holes are bored at the large intervals by the dry etching; and next, the holes are enlarged by the wet etching to adjust the width of the gap.

The size of the bored hole is equal to or larger than a given value based on the precision of the etching. However, the arrangement pattern of the holes is devised, whereby a method of increasing the number of paths for the currents is present.

Figure 5:
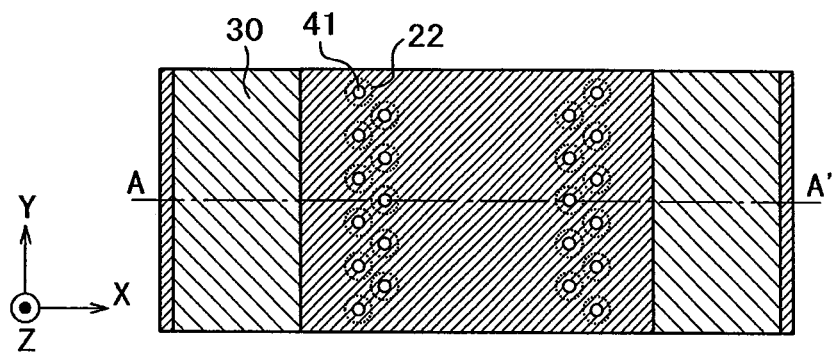
FIG. 5 is an element plane schematic view explaining a process for manufacturing the integrated light-emitting element of Example 1 according to the present invention.

FIG. 5 is an example in which the holes are not arranged in a straight line, but are arranged in a zig-zag manner. The number of paths (one-dimensional confinement regions) per unit length in the Y direction (in the vertical direction of the paper in FIG. 5) is larger than the case of the straight-line arrangement of FIG. 4.

Figure 6:
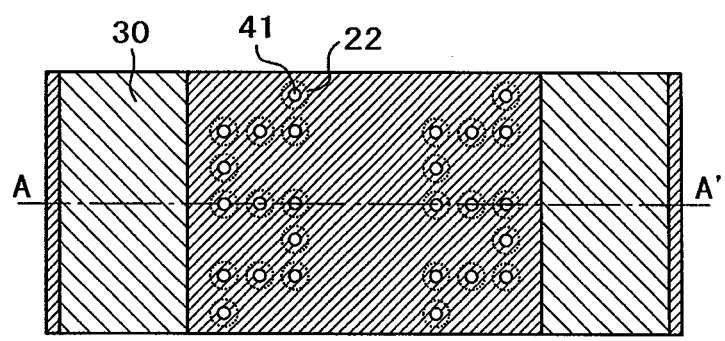
FIG. 6 is an element plane schematic view explaining a process for manufacturing the integrated light-emitting element of Example 1 according to the present invention.

FIG. 6 is an example in which the arrangement of the holes is further largely waved. The examples of FIG. 4 and FIG. 5 have a feature that when the electric field is applied in the x direction, all of the one-dimensional confinement regions arranged have the same electric potential. However, in the example of FIG. 6, all of the one-dimensional confinement regions arranged do not have the same electric potential. For this reason, although there is a problem that the current tends to be concentrated on a partial gap, instead, there is an advantage that the width of the wave undulation is large, thereby making it possible to dramatically increase the number of carrier paths.

Figure 7:
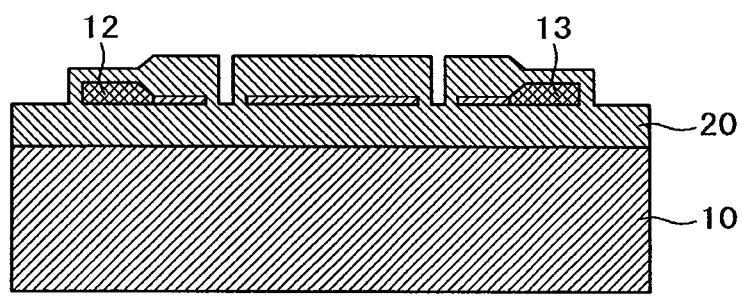
FIG. 7 is an element cross-sectional view explaining a process for manufacturing the integrated light-emitting element of Example 1 according to the present invention.

Suppose that either one of FIG. 4, FIG. 5, and FIG. 6 is adopted for the arrangement pattern of the holes. Next, as shown in a schematic cross-sectional view of FIG. 7, the silicon nitride layer 30 on the surface is removed away, and a p-type dopant and an n-type dopant are respectively implanted into the left and right silicon layers which have underlain the silicon nitride layer 30 and the thicknesses of which are left by an ion implantation method, thereby activating them. As a result, a p-type doped region 12 and an n-type doped region 13 are formed.

Figure 8:
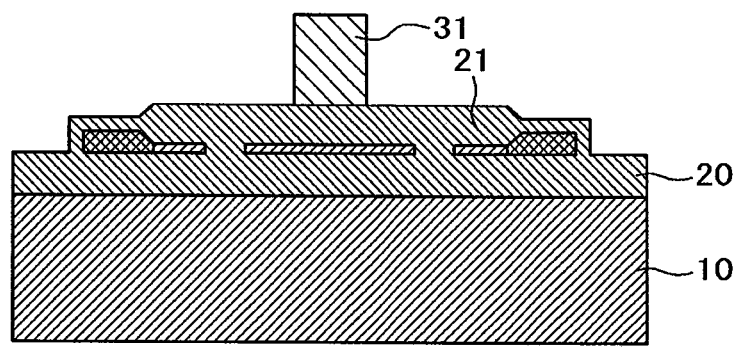
FIG. 8 is an element cross-sectional view explaining a process for manufacturing the integrated light-emitting element of Example 1 according to the present invention.

FIG. 8 shows a state in which next, a silicon oxide film 21 is stacked to fill the holes, and a silicon nitride 31 is patterned to be disposed on the light-emitting region. The silicon nitrides 31 each has a thickness of about 100 nm in the depth direction of the paper, and are disposed so as to be arranged at intervals each of which is just half an emission wavelength of the silicon thin film, including the thickness of the silicon nitride 31, and play a part of waveguides and DFB mirrors.

Figure 9:
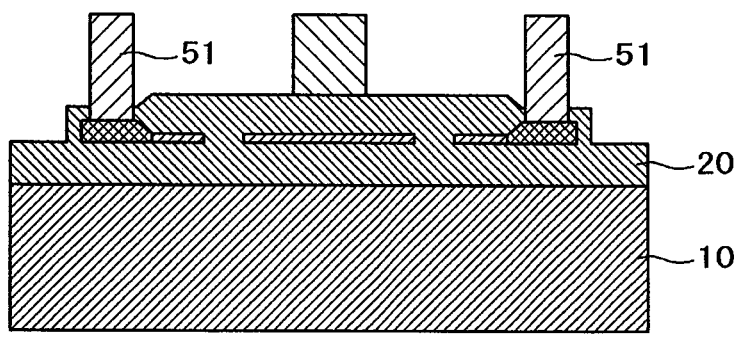
FIG. 9 is an element cross-sectional view explaining a process for manufacturing the integrated light-emitting element of Example 1 according to the present invention.

FIG. 9 shows a state in which next, holes are bored in the silicon oxide film and aluminum electrodes 51 are formed so as to be connected to the p-type silicon region 12 and the n-type silicon region 13, respectively. After that, the whole is covered with a predetermined film, which leads to the completion of the element.

Figure 10:
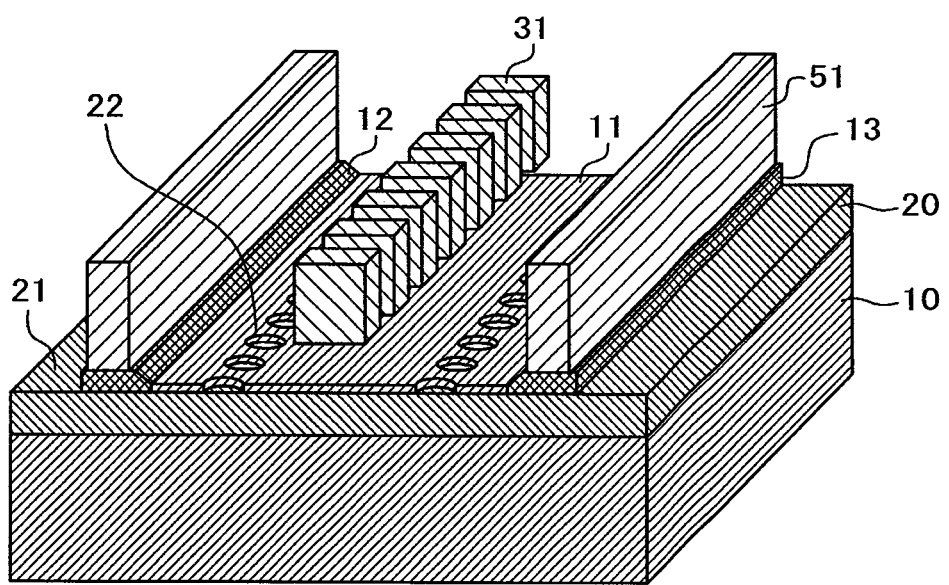
FIG. 10 is a bird's eye schematic view explaining a structure of the integrated light-emitting element of Example 1 according to the present invention.

FIG. 10 is a schematic bird's view when the completed element is viewed from an oblique angle. However, for the understandability, the drawing is made with the silicon oxide film 21 on the surface being omitted.

It is noted that although in this case, the silicon thin film element is given as the example, the same light-emitting element can also be manufactured with a germanium thin film by the same method.

Example 2

There will now be shown a method in which in the fin silicon light-emitting element shown in PTL 2, constriction structures are formed in both ends of the individual silicon thin films composing the fins, and are made the one-dimensional quantum confinement regions to form the barrier regions, thereby obtaining the same effects as those in the double hetero-structure.

Figure 11:
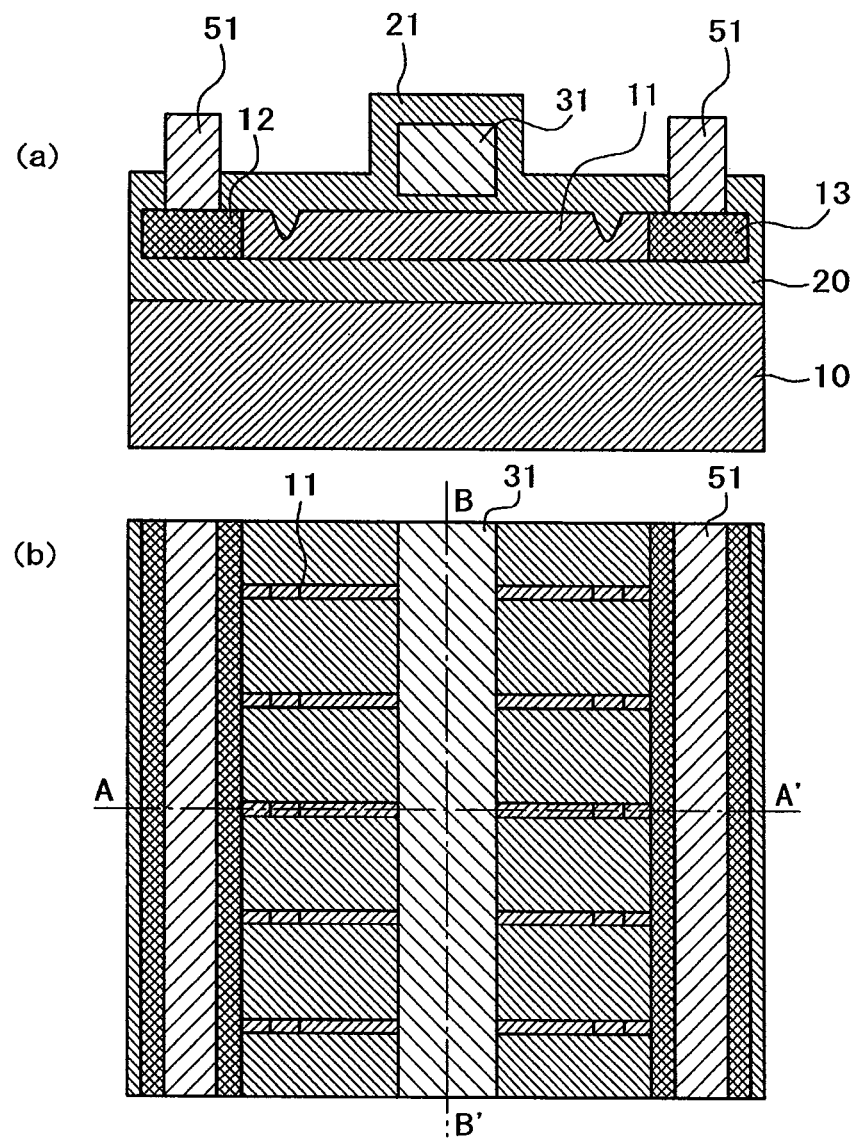
FIG. 11(a) is an element cross-sectional schematic view explaining a process for manufacturing an integrated light-emitting element of Example 2 according to the present invention.
FIG. 11(b) is an element plane schematic view.

FIG. 11 shows a finally completed structure of a fin silicon light-emitting element having the constriction structure. A lower figure is a view when viewed from the above of the element, and an upper figure is a cross-sectional view on line A-A' of the lower figure. However, in the top plan view of the lower figure, for simplicity of the structure, the drawing is made with the silicon oxide film 21 as the protective film being omitted. The silicon oxide film 20 is stacked on the silicon supporting substrate 10, and the silicon thin films 11 are arranged in fins on the silicon supporting substrate 10. The p-type silicon regions 12 and the n-type silicon regions 13 are connected to the silicon thin films 11, and aluminum electrodes 51 are further connected to the p-type silicon regions 12 and the n-type silicon regions 13. Also, waveguides each made of a silicon nitride 31 are disposed on the upper portions of the silicon thin films 11, and a portion other than electrode extracting portions is covered with the silicon oxide film 21.

Figure 12:
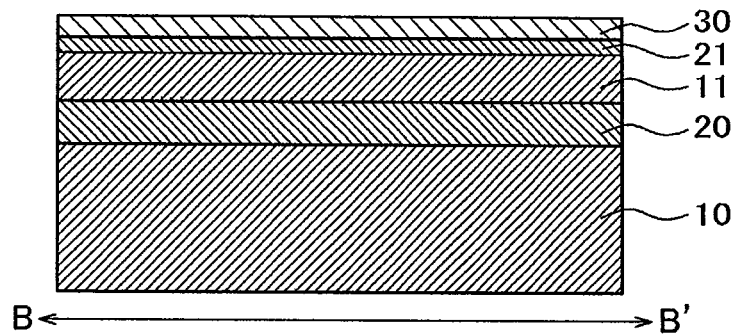
FIG. 12 is an element cross-sectional view explaining a process for manufacturing the integrated light-emitting element of Example 2 according to the present invention.

FIG. 12 shows a first stage for manufacturing the structure concerned, and is a cross-sectional view along a position and a direction on line B-B' of the lower figure of FIG. 11. Firstly, the silicon oxide film 20 having a thickness of 1 μm is stacked on the silicon supporting substrate 10, and the single crystal silicon thin film 11 having the thickness of 300 nm is formed on that silicon oxide film. Since in Example 2, the silicon thin film (silicon fin) is formed so as to be vertically set up, a width of the final silicon fin becomes equal to or smaller than the thickness of the silicon thin film 11 at this time point. For ensuring the volume of the light-emitting region, the wider the width is, the better. However, since the fin structure having the uniform thickness is easy to form when the width is narrower, this thickness is adopted. A silicon oxide film 21 is formed on the single crystal silicon thin film 11 through natural oxidation. A silicon nitride layer having a thickness of about 50 nm is further formed on the silicon oxide film 21.

Figure 13:
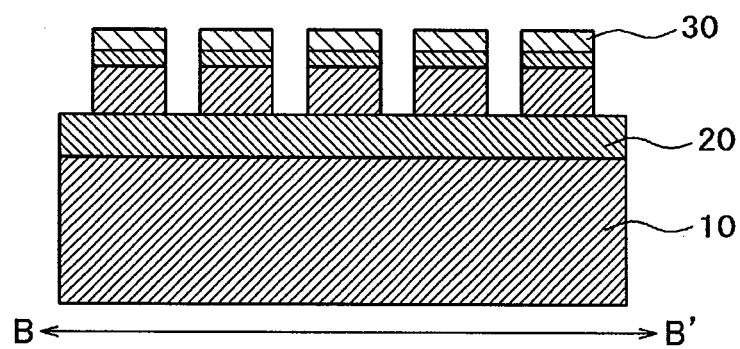
FIG. 13 is an element cross-sectional view explaining a process for manufacturing the integrated light-emitting element of Example 2 according to the present invention.

FIG. 13 is a block structure which is formed by a combination of the dry etching and the wet etching after a resist is stacked on the structure of FIG. 12 and the patterning is then carried out. A width of the block structure overlying the silicon oxide film 20 is about 50 nm, and the individual blocks are made to be arranged side by side at intervals of about 250 nm. This interval is determined so as to become just half a wavelength of the light emitted from the silicon film in such a way that the interval itself of the silicon fins plays a part of the DFB mirror.

Figure 14:
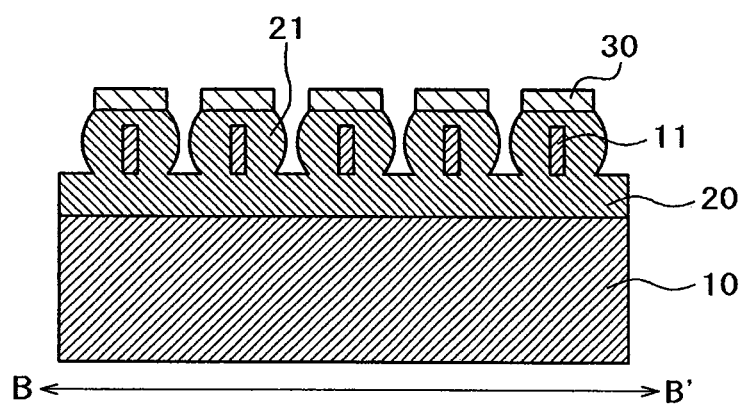
FIG. 14 is an element cross-sectional view explaining a process for manufacturing the integrated light-emitting element of Example 2 according to the present invention.

As shown in FIG. 14, next, the thermal oxidation is carried out, thereby thinning the silicon portion 11.

Figure 15:
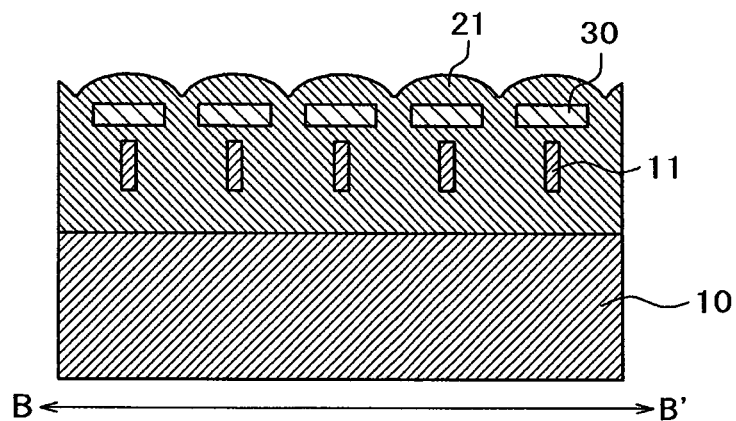
FIG. 15 is an element cross-sectional view explaining a process for manufacturing the integrated light-emitting element of Example 2 according to the present invention.

After that, as shown in FIG. 15, a silicon oxide film is laminated on the silicon nitride so as to lie on the silicon nitride at about 50 nm. As a result, the gap between the silicon fins 11 is entirely filled with the silicon oxide film.

Figure 16:
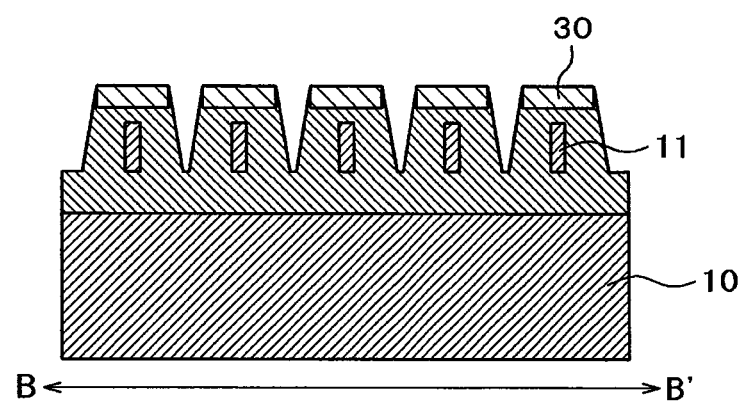
FIG. 16 is an element cross-sectional view explaining a process for manufacturing the integrated light-emitting element of Example 2 according to the present invention.

Next, as shown in FIG. 16, the silicon oxide film on the silicon nitride is removed away by the dry etching. At this time, the silicon oxide film in a portion which is not covered with the nitride is removed away at the same time.

Figure 17:
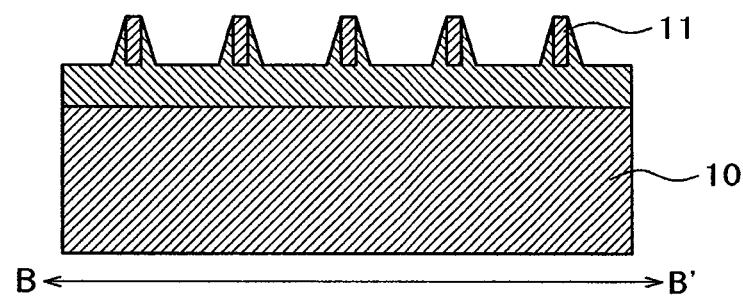
FIG. 17 is an element cross-sectional view explaining a process for manufacturing the integrated light-emitting element of Example 2 according to the present invention.

Moreover, as shown in FIG. 17, the silicon nitride layer is removed away by the wet etching. At this time, the great part of the silicon oxide film which has underlain the nitride is also removed away.

Figure 18:
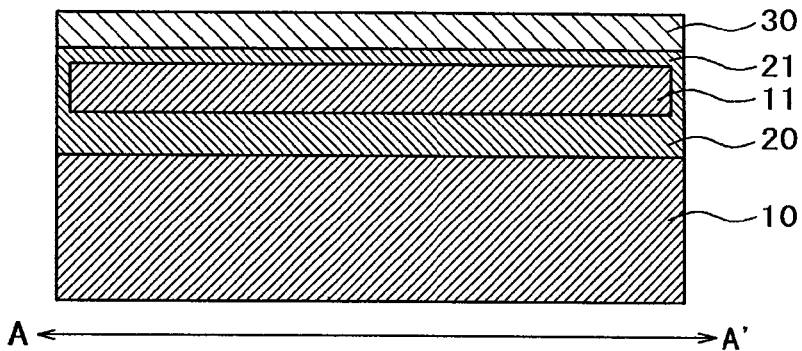
FIG. 18 is an element cross-sectional view explaining a process for manufacturing the integrated light-emitting element of Example 2 according to the present invention.

FIG. 18 is a cross-sectional view after the silicon oxide film 21 is laminated in a predetermined thickness of 20 nm to 40 nm, and the silicon nitride 30 is laminated in a predetermined thickness of 50 nm to 250 nm. This is a cross-sectional view, on line A-A' of the lower figure of FIG. 11, in a position where the silicon fins are present.

Figure 19:
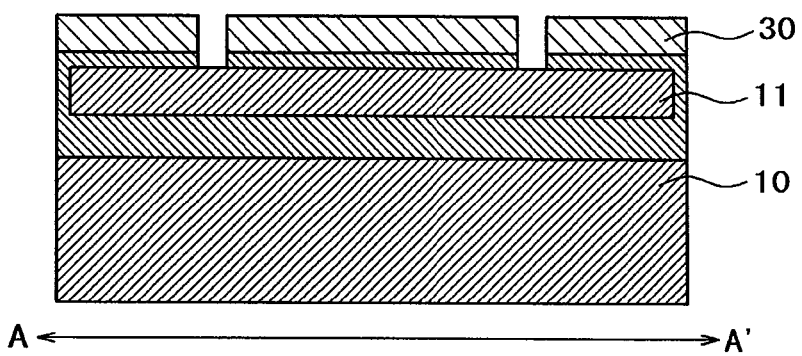
FIG. 19 is an element cross-sectional view explaining a process for manufacturing the integrated light-emitting element of Example 2 according to the present invention.

FIG. 19 is a cross-sectional view after the patterning is carried out, thereby boring the holes in the upper portions of the positions where the constriction structure of the silicon fins are to be formed.

Figure 20:
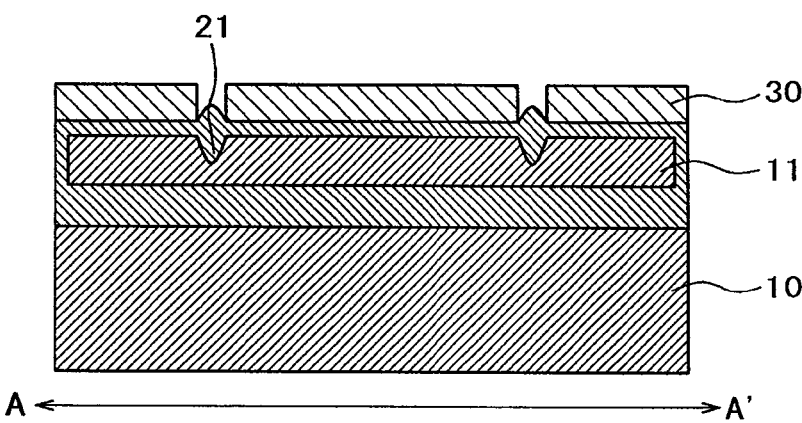
FIG. 20 is an element cross-sectional view explaining a process for manufacturing the integrated light-emitting element of Example 2 according to the present invention.

Next, as shown in FIG. 20, by carrying out the thermal oxidation, the oxidation of the silicon fins in the portions in which the holes have been bored proceeds, and these portions become the constriction structures. The thermal oxidation is adjusted in such a way that the width of the portion which was constricted to be left becomes approximately 5 nm.

Figure 21:
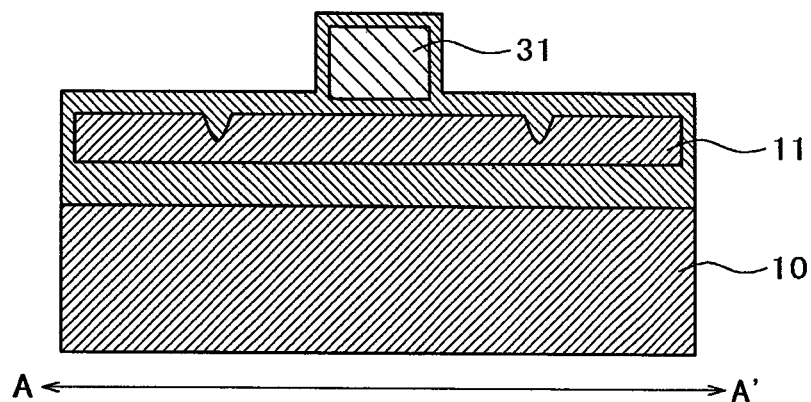
FIG. 21 is an element cross-sectional view explaining a process for manufacturing the integrated light-emitting element of Example 2 according to the present invention.

Next, the silicon nitride layer is removed away, and the silicon oxide film is laminated again to planarize the upper surface. After that, the silicon nitride layer 31 which is to function as the waveguide is laminated again in a thickness of 250 nm. Next, the patterning is carried out to leave only the silicon nitride 31 in the predetermined position and to remove away the silicon nitride in other portions. Also, the silicon oxide film as the protective film is laminated in a thickness of approximately 30 nm. The structure formed as a result is shown in FIG. 21.

Next, the p-type doped silicon region 12 and the n-type doped silicon region 13 are formed by the ion implantation, and the silicon oxide film is laminated again in a thickness of approximately 50 nm. After that, the doped regions are activated by the heat treatment at a predetermined temperature. Next, the patterning is carried out to bore the holes in the silicon oxide film on the doped silicon regions 12 and 13 by the wet etching. Also, the aluminum electrodes 51 are formed in the holes. A cross-sectional view and a top plan view of the structure as a result are shown in FIG. 11.

Figure 22:
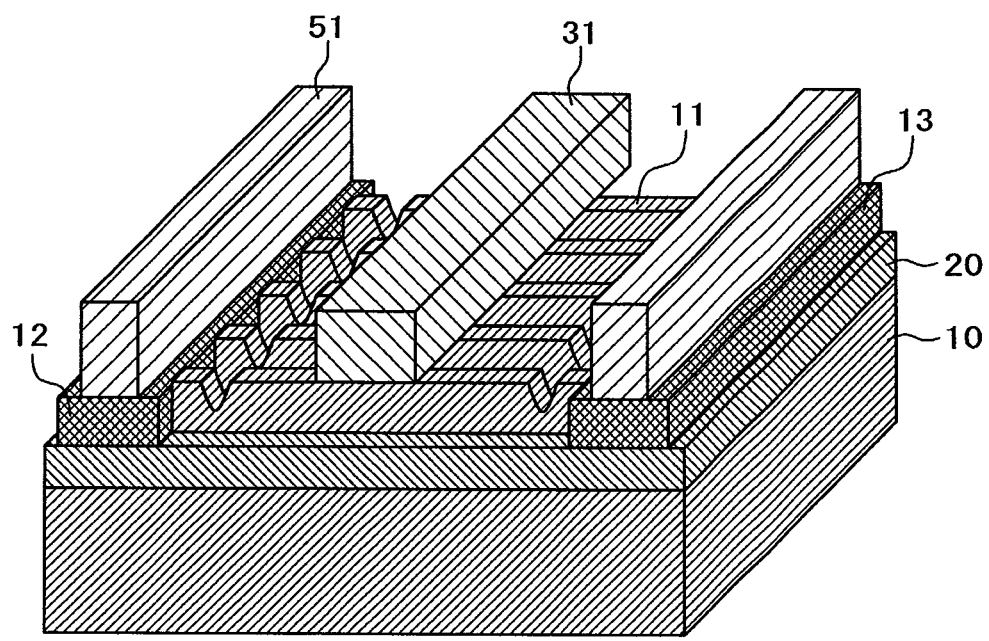
FIG. 22 is a bird's eye schematic view explaining a structure of the integrated light-emitting element of Example 2 according to the present invention.

In addition, FIG. 22 is a bird's eye view of this structure. However, for understandability, the drawing is made with the silicon oxide film 21 omitted.

There is shown the method of introducing the constriction structure to the fin silicon light-emitting element as an example in order to realize the carrier confinement here. The same effect, however, can be obtained by the same method even in the fin light-emitting element by germanium.

Example 3

Although germanium is the indirect transition semiconductor, unlike silicon, the energy level at the point L as the conduction band lowest point, and the energy level at the minimum point which is present at the point T are close to each other. Therefore, if a large amount of electrons are implanted, then, the electrons can be implanted into the point Γ as well. Since the light emission from the point Γ in such a form is obtained in the bulk as well independently of the shape of the element, the germanium light-emitting element may use a thick film. A method is shown in which for this reason the central portions (light-emitting regions) of the individual fins of the fin germanium light-emitting element are thickened, and the end portions to which the electrode are connected are thinned, whereby the barrier regions for the carriers are formed by the quantum confinement effect in the thin portions, thereby obtaining the same effects as those in the double hetero-structure.

Figure 23:
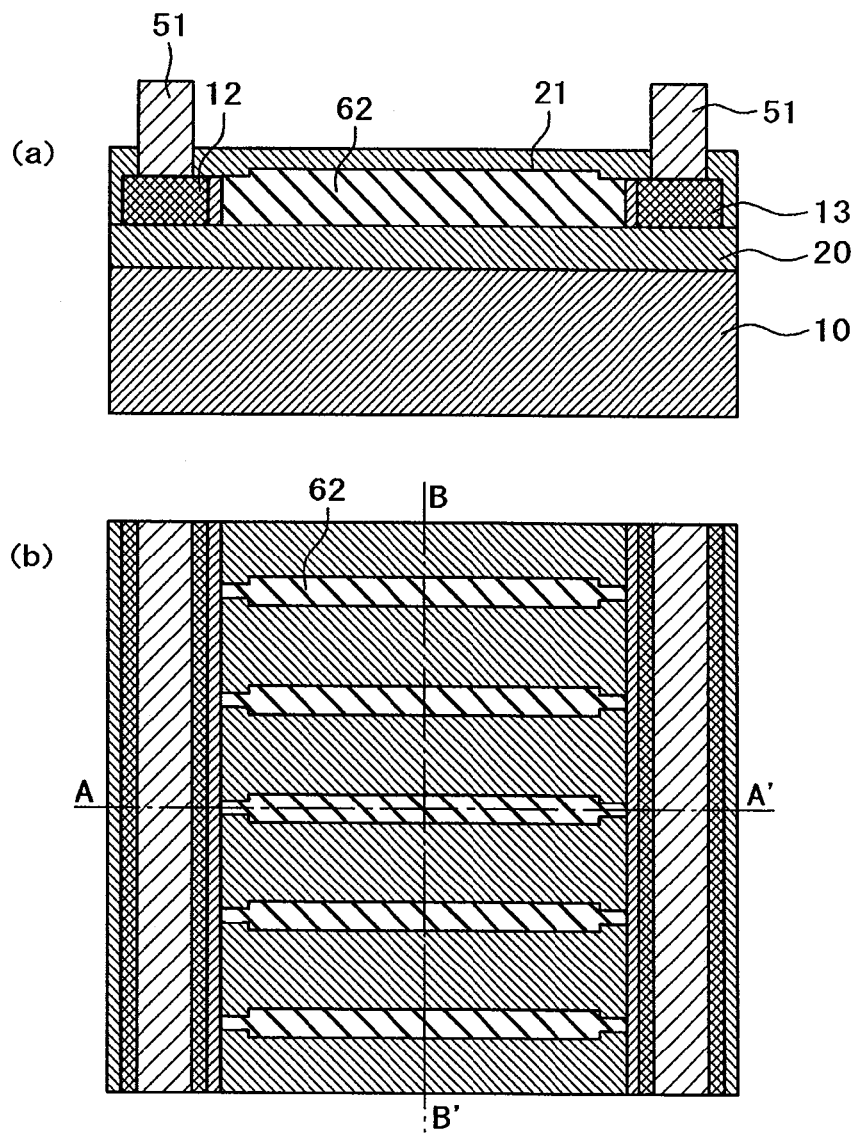
FIG. 23(a) is an element cross-sectional schematic view explaining a process for manufacturing an integrated light-emitting element of Example 3 according to the present invention.
FIG. 23(b) is an element plane schematic view.

FIG. 23 shows a structure in which in the fin germanium light-emitting element which is finally completed by Example 3, the connection portions to the electrodes on the both sides of the individual fins are thinned. A lower figure is a top plan view when viewed from the above of the device, and an upper figure is a cross-sectional view on line A-A' of the low figure. However, in the top plan view of the lower figure, for simplicity of the structure, the drawing is made with the silicon oxide film 21 as the protective film omitted. The silicon oxide film 20 is stacked on the silicon supporting substrate 10. The germanium thin films 62 the central portions of which are thick, the both ends of which are thin are arranged in fins on the silicon oxide film 20. The p-type silicon region 12 and the n-type silicon region 13 are each connected to the thin both ends. Also, the aluminum electrodes 51 are each connected to the p-type silicon region 12 and the n-type silicon region 13, and the whole except for the extracting portion from the electrodes to the wires is covered with the silicon oxide film 21. The fin germanium light-emitting element has the structure described above.

Figure 24:
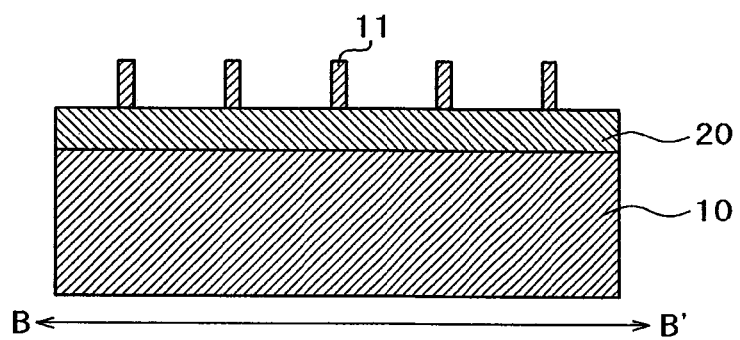
FIG. 24 is an element cross-sectional view explaining a process for manufacturing the integrated light-emitting element of Example 3 according to the present invention.

FIG. 24 shows a stage of the middle of manufacturing this structure in the form of a cross-sectional view on line B-B' of FIG. 23. The silicon fin structures 11 are formed on the silicon supporting substrate and the silicon oxide film by the same method as that in Example 2. At this time, the side surfaces of the silicon fins are barely covered with the silicon oxide film, and thus the silicon crystal is made to be exposed by the etching.

Figure 25:
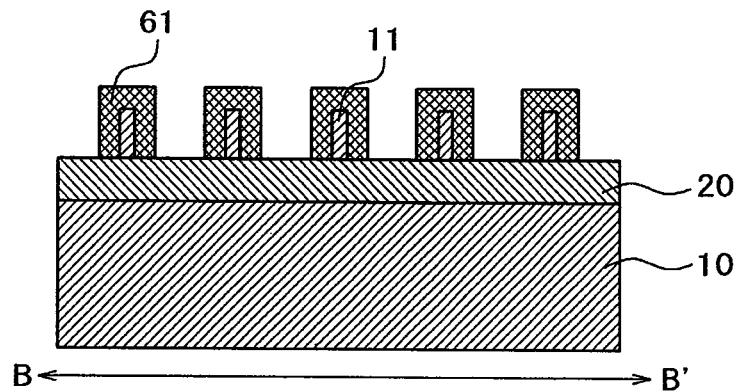
FIG. 25 is an element cross-sectional view explaining a process for manufacturing the integrated light-emitting element of Example 3 according to the present invention.
Figure 26:
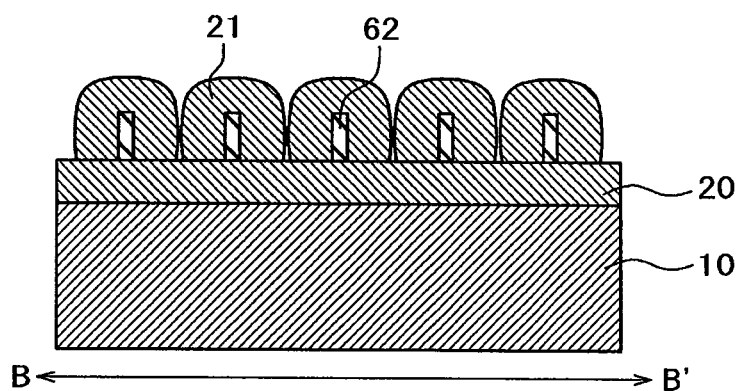
FIG. 26 is an element cross-sectional view explaining a process for manufacturing the integrated light-emitting element of Example 3 according to the present invention.

As shown in FIG. 25, next, silicon-germanium 61 is evaporated on that structure. In this silicon-germanium, silicon and germanium are disorderly disposed. When the silicon-germanium is subjected to the thermal oxidation treatment, as shown in FIG. 26 only silicon is oxidized to be swelled outward in the form of the silicon oxide film 21. Only germanium is left out without being oxidized, and then, the temperature rises step by step (concentrated oxidization). Finally, the silicon fins present from the beginning are also oxidized, and only germanium contained in the silicon-germanium is left out in the positions where silicon fins were present to be the germanium fins 62. It is important that the thermal oxidation treatment is ended at a time when such state is obtained. When the thermal oxidation treatment is continuously carried out even after silicon has been oxidized, germanium begins to be oxidized, and thus the germanium fins are not left out.

Figure 27:
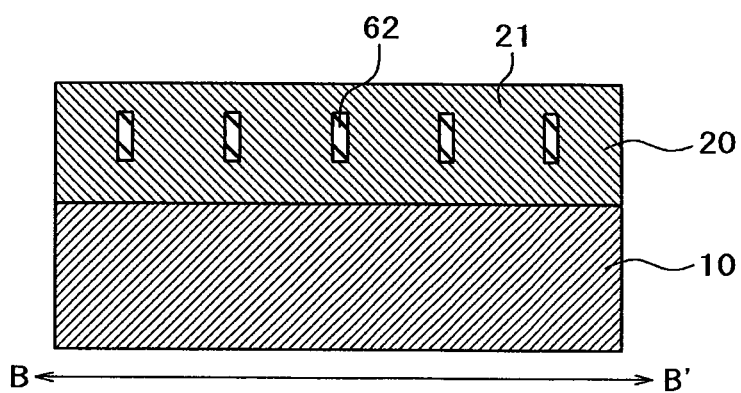
FIG. 27 is an element cross-sectional view explaining a process for manufacturing the integrated light-emitting element of Example 3 according to the present invention.
Figure 28:
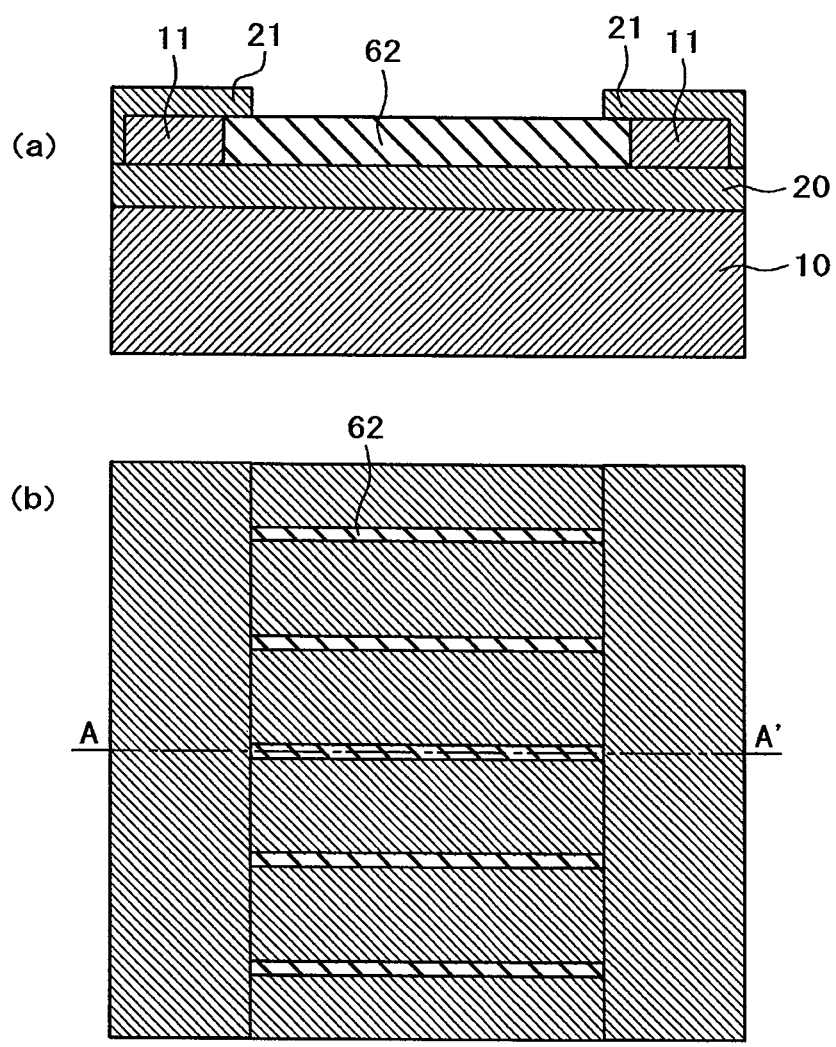
FIG. 28(a) is an element cross-sectional schematic view explaining a process for manufacturing the integrated light-emitting element of Example 3 according to the present invention.
FIG. 28(b) is an element plane schematic view.

Next, as shown in FIG. 27, a silicon oxide film is laminated to fill the gaps of the germanium fin structure. Next, patterning is carried out to remove away the silicon oxide film 21 so as to expose the central portions of the germanium fins like FIG. 28. At this time, of the germanium fins 62, the portion of the both ends connected to the silicon crystal 11 needs to be in a state in which that portion is covered with the silicon oxide film 21 and thus is not exposed.

Figure 29:
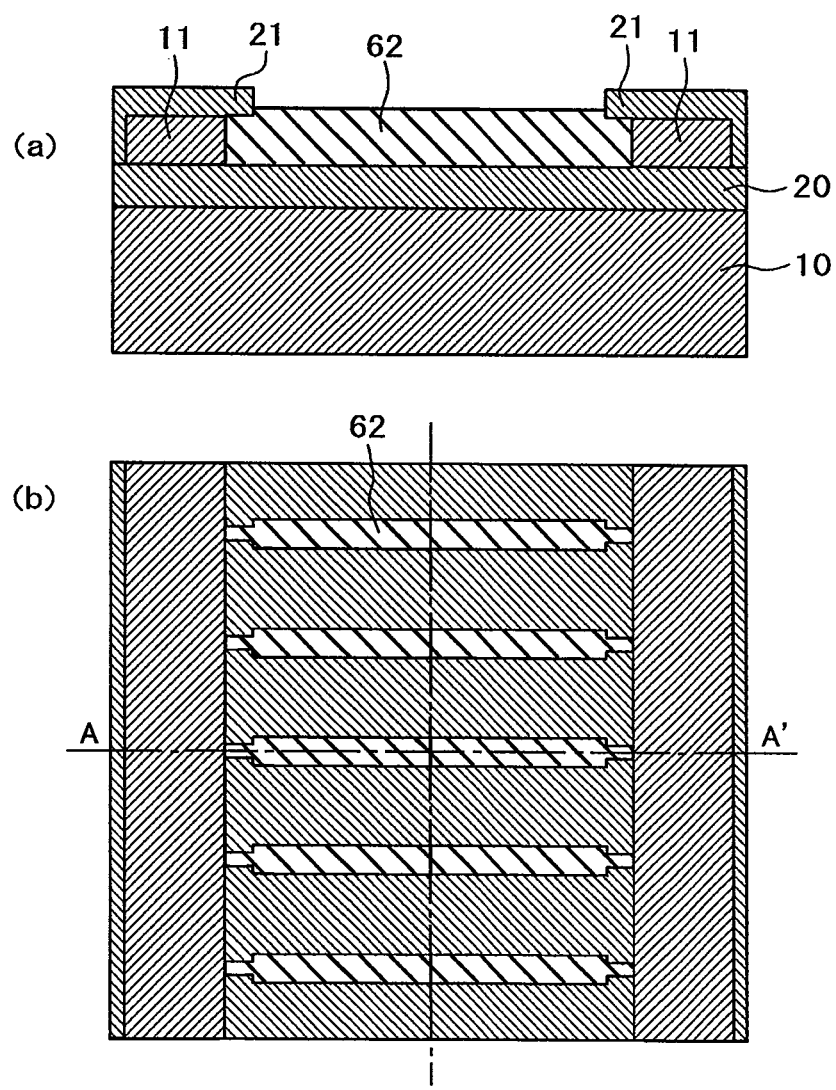
FIG. 29(a) is an element cross-sectional schematic view explaining a process for manufacturing the integrated light-emitting element of Example 3 according to the present invention.
FIG. 29(b) is an element plane schematic view.

Next, as shown in FIG. 29, germanium is evaporated to thicken the germanium fins. A top plan view of a lower figure of FIG. 29 is drawn with the silicon oxide film 21 omitted for the understandability. As a result, there is obtained a structure in which the greater part of the germanium fins 62 is thick, and only the portion of the both ends connected to the silicon crystal 11 is thin.

Figure 30:
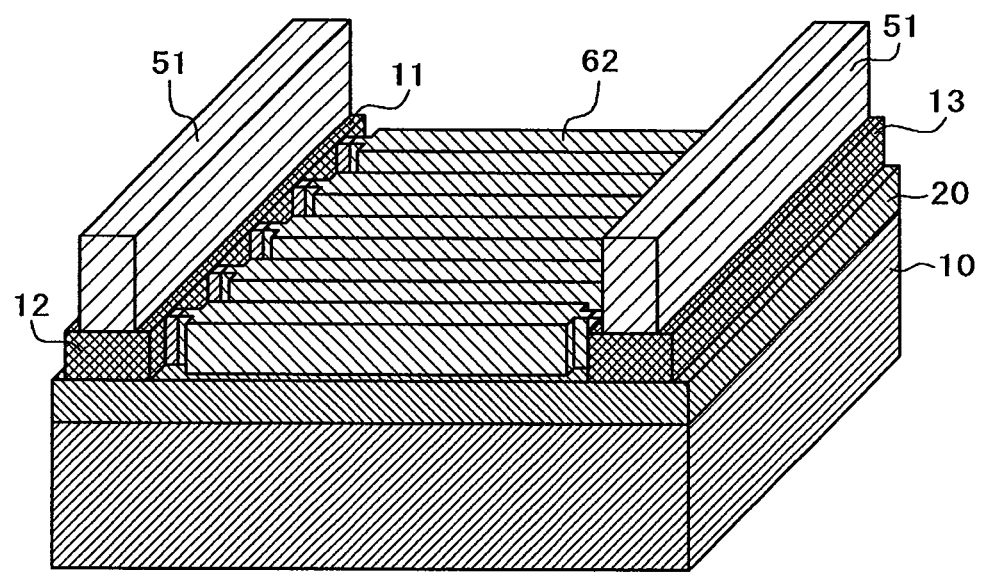
FIG. 30 is a bird's eye schematic view explaining a structure of the integrated light-emitting element of Example 3 according to the present invention.

Like FIG. 23 previously shown. After this, the p-type doped region 12 and the n-type doped region 13 are formed by the ion implantation, and the silicon oxide film is laminated. Also, the aluminum electrodes 51 are each connected to the p-type doped region 12 and the n-type doped region 13. Thus, the structure is formed in the manner as described above. As a result, the fin germanium light-emitting element can be manufactured in which the thinner portions of the germanium thin film were made the barrier structure for the carriers. FIG. 30 shows a bird's eye view of this structure. However, in this case as well, for understandability, the drawing is made with the silicon oxide film as the germanium film omitted. It is noted that since in this case the germanium fin itself plays a part of the waveguide at the same time, the silicon nitride layer as the waveguide is not formed.

REFERENCE SIGNS LIST

10 . . . silicon substrate
11 . . . single crystal silicon
12 . . . p-type doped silicon
13 . . . n-type doped silicon
20, 21 . . . silicon oxide film
22 . . . hole obtained by further enlarging hole 41
30 . . . silicon nitride
31 . . . waveguide by silicon nitride
41 . . . hole bored in silicon oxide film and silicon thin film
51 . . . aluminum electrode
62 . . . single crystal germanium
61 . . . silicon-germanium

The invention claimed is:

1. A light-emitting element comprising:
an insulating layer provided on a semiconductor substrate;
a first electrode for implanting electrons and a second electrode for implanting holes, the first and second electrodes being provided on the insulating layer; and
a light-emitting portion electrically connected to the first and second electrodes and composed of a thin film extending in parallel with a surface of the semiconductor substrate on the insulating layer, wherein the thin film is composed of either a silicon crystal or a germanium crystal and has such a film thickness that light is emitted by implantation of the electrons and holes, wherein the thin film includes two regions in which holes are disposed at a predetermined interval in a longitudinal direction in vicinities of the first and second electrodes, respectively, and wherein a gap between adjacent holes of the two regions in which holes are disposed is equal to or less than 10 nm.

2. The light-emitting element according to claim 1, wherein the holes disposed in each region are disposed in two columns in the longitudinal direction having the center of each hole offset from one another in a direction perpendicular to the longitudinal direction, and wherein the adjacent holes in each column in the longitudinal direction are disposed in a predetermined interval.

3. The light-emitting element according to claim 1, wherein a waveguide for guiding the light emitted from the light-emitting portion is provided on the light-emitting portion.

4. A light-emitting element comprising:

an insulating layer provided on a semiconductor substrate;

a first electrode for implanting electrons and a second electrode for implanting holes, the first and second electrodes being provided on the insulating layer; and a light-emitting portion electrically connected to the first and second electrodes and composed of a thin film extending in parallel with a surface of the semiconductor substrate on the insulating layer, wherein the thin film is composed of either a silicon crystal or a germanium crystal and has such a film thickness that light is emitted by implantation of the electrons and holes, wherein the thin film includes two regions in which holes are disposed at a predetermined interval in a longitudinal direction in vicinities of the first and second electrodes, respectively, and wherein the thickness of the thin film is less than 5 nm.

5. The light emitting element according to claim 4, wherein a gap between adjacent holes of the two regions in which holes are disposed is equal to or less than 10 nm.

6. The light emitting element according to claim 4, wherein the holes disposed in each region are disposed in two columns in the longitudinal direction having the center of each hole offset from one another in a direction perpendicular to the longitudinal direction, and wherein the adjacent holes in each column in the longitudinal direction are disposed in a predetermined interval.

7. The light emitting element according to claim 4, wherein a waveguide for guiding the light emitted from the light-emitting portion is provided on the light-emitting portion.

* * * * *